United States Patent
Sim

(10) Patent No.: US 6,819,600 B2
(45) Date of Patent: Nov. 16, 2004

(54) SEMICONDUCTOR MEMORY DEVICE WITH OFFSET-COMPENSATED SENSING SCHEME

(75) Inventor: Jae-Yoon Sim, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/611,788

(22) Filed: Jun. 30, 2003

(65) Prior Publication Data

US 2004/0027892 A1 Feb. 12, 2004

(30) Foreign Application Priority Data

Jul. 2, 2002 (KR) .................................. 10-2002-0037851

(51) Int. Cl.[7] .............................................. G11C 11/34
(52) U.S. Cl. .................................. 365/189.07; 365/207
(58) Field of Search ............................ 365/189.07, 207

(56) References Cited

U.S. PATENT DOCUMENTS 5,177,453 A * 1/1993 Russell et al. .............. 330/284

OTHER PUBLICATIONS

Article from IEEE Journal of Solid–State Circuits, vol. 29 No. 1, pp. 9–13 Jan. 1994, entitled "Offset Compensating Bit–Line Sensing Scheme For High Density Dram's".

* cited by examiner

Primary Examiner—M. Tran
(74) Attorney, Agent, or Firm—Marger Johnson & McCollom, P.C.

(57) ABSTRACT

Disclosed is a semiconductor memory device which includes an offset-compensated amplifier circuit. The offset-compensated amplifier circuit enables a flip-flop sense amplifier to perform a stable sensing operation irrespective of its own offset voltage. A part of the offset-compensated amplifier circuit is located in a first region (for example, a region that includes the flip-flop sense amplifier), and the other thereof is located in a second region (for example, a region where drivers related to the flip-flop sense amplifier are located). With this distributed arrangement structure, an offset-compensated amplifier circuit can be obtained n the semiconductor memory device.

57 Claims, 17 Drawing Sheets

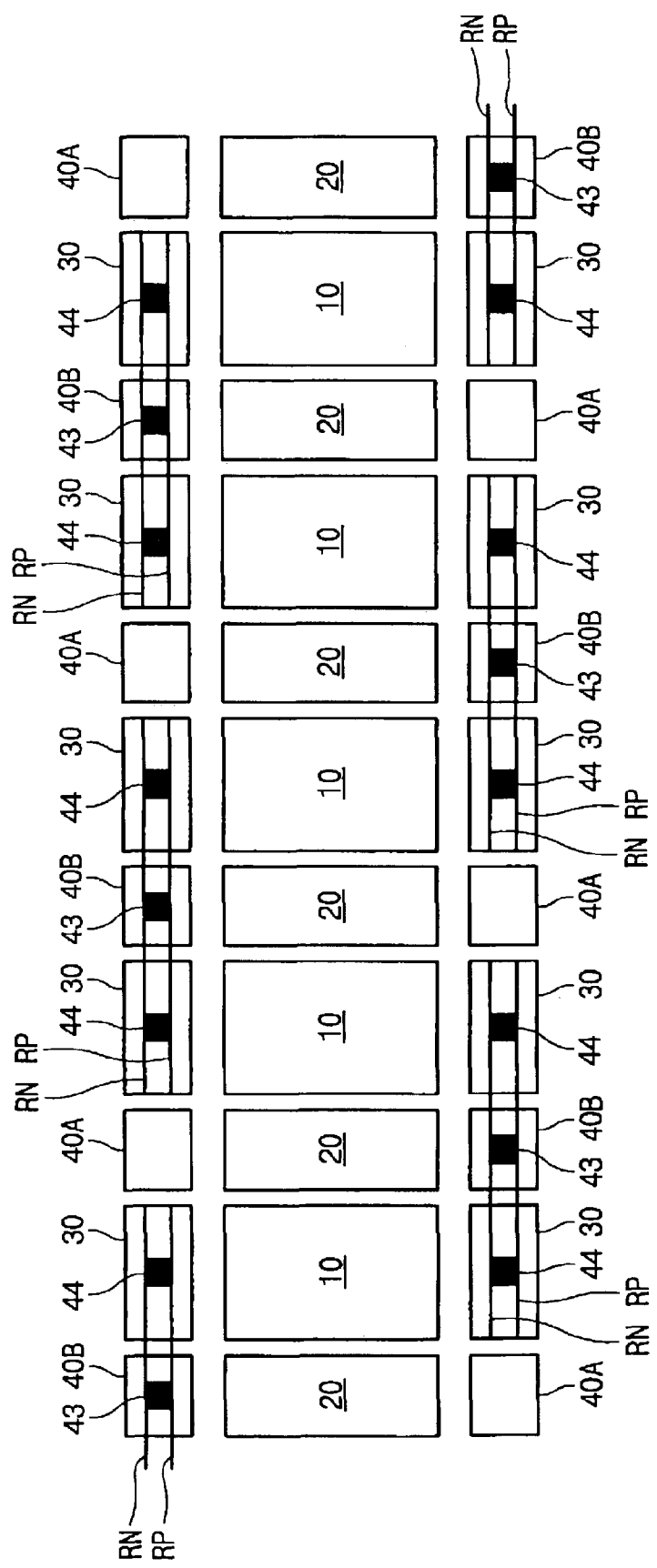

SEMICONDUCTOR MEMORY DEVICE WITH OFFSET-COMPENSATED SENSING SCHEME

CROSS REFERENCE TO RELATED APPLICATIONS

This application claims priority from Korean Patent Application No. 2002-37851, filed on Jul. 2, 2002, the contents of which are herein incorporated by reference in their entirety for all purposes.

BACKGROUND OF THE INVENTION

1. Technical Field of the Invention

This disclosure relates to integrated circuit devices, and in particular to a semiconductor memory device that is capable of stable operation at a low power supply voltage.

2. Description of the Related Art

One of the essential circuits for realizing high-performance DRAMs is a bit line sense amplifier circuit. In a DRAM read operation, as understood by those skilled in the art, a small amount of charge is transferred from a memory cell to a bit line, and a sense amplifier senses and amplifies the voltage on the bit line. In the case of high-density DRAMs, it is increasingly difficult to perform a stable read operation because signal charges stored in a memory cell are reduced, owing to decreases in cell size and operating voltage. Therefore, a sense amplifier with higher sensitivity than presently available is necessary.

Because of its simple structure and high sensitivity, a dynamic cross-coupled sense amplifier (hereinafter referred to as a flip-flop sense amplifier) has been widely used as a bit line sense amplifier. The sensitivity of a sense amplifier is affected by imbalanced device parameters, for example, the threshold voltage and transconductance inconsistency between paired transistors. In the case of high-density DRAMs, this imbalance is increased because a large number of transistors with a scaled-down feature size are used in the high-density DRAM. An offset voltage of a flip-flop sense amplifier results from the device parameter imbalance. The offset voltage of the flip-flop sense amplifier causes a reduced sensing margin.

In general, in cases where an offset voltage of a sense amplifier is lower than a bit line voltage induced by charge sharing between capacitance of a memory cell and capacitance of a bit line, read/refresh operations are performed normally. On the other hand, in cases where the offset voltage of the sense amplifier is higher than the induced bit line voltage, the read/refresh operations are not carried out normally. This means that an offset voltage of a sense amplifier gives rise to a decrease in the sensing margin. The decrease in the sensing margin limits the store or refresh time. In cases where a memory device operates at a low power supply voltage, the sensitivity of the sense amplifier is greatly affected by the offset voltage because the voltage induced on a bit line is relatively reduced.

Various circuit techniques have been proposed that minimize the impact upon the imbalance or offset voltage owing to a flip-flop sense amplifier. One such circuit technique is to compensate for the threshold voltage mismatch of paired sense transistors by adjusting a bit line precharge level. This technique obtains high sensitivity only in cases where the imbalance is caused by an imbalance between threshold voltages. Another technique is to suppress the overall electric imbalance of a sense amplifier by adopting a simple offset compensation, which is disclosed in the IEEE Journal of Solid-State Circuits, Vol. 29 No. 1, pp. 9–13 January 1994, entitled "OFFSET COMPENSATING BIT-LINE SENSING SCHEME FOR HIGH DENSITY DRAM'S".

An offset compensating bit-line sensing (OCS) scheme disclosed in the reference can remove the overall electric imbalance of paired transistors of a sense amplifier. In the OCS scheme, a differential amplifier for compensating an offset voltage of a sense amplifier is disposed in a sense amplification region. In case of high-density DRAM's, however, it is difficult to include a sense amplifier of the OCS scheme in a limited sense amplification region using present process techniques.

Embodiments of the invention overcome this and other limitations in the prior art.

SUMMARY OF THE INVENTION

Embodiments of the invention provide a layout structure for an offset-compensated amplifier circuit that enables a flip-flop sense amplifier to perform a stable sensing operation irrespective of its own offset voltage.

Other embodiments of the invention provide a semiconductor memory device that includes an offset-compensated amplifier circuit. The offset-compensated amplifier circuit enables a flip-flop sense amplifier to perform a stable sensing operation irrespective of its own offset voltage. A part of the offset-compensated amplifier circuit is situated at, for example, a same region where the flip-flop sense amplifier is, and the other part situated at, for example, a region where drivers related to the flip-flop sense amplifier are. For example, the drivers include PEQ drivers, LA and LAB drivers, and so on. With this distributed arrangement, offset-compensated amplifier circuits can be obtained.

BRIEF DESCRIPTION OF THE DRAWINGS

A more complete appreciation of the invention, and many of the attendant advantages thereof, will become readily apparent as the same becomes better understood by reference to the following detailed description when considered in conjunction with the accompanying drawings in which like reference symbols indicate the same or similar components.

FIG. 12 is a layout diagram of an offset-compensated amplifier circuit according to an additional embodiment of the invention.

DETAILED DESCRIPTION OF THE INVENTION

The preferred embodiments of the invention will be more fully described with reference to the attached drawings.

Figure 1A:
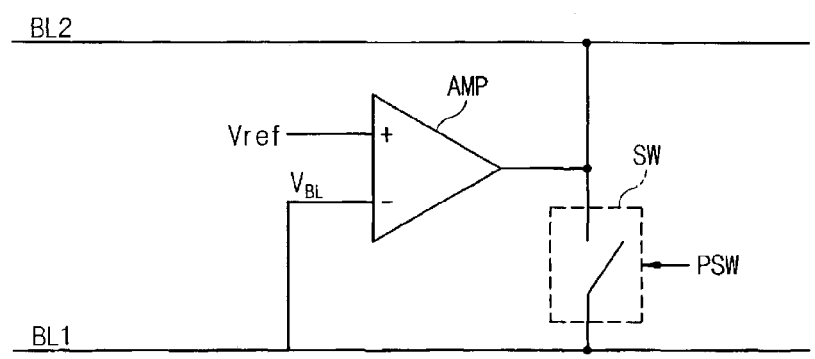
FIG. 1A is a functional block diagram of an offset-compensated amplifier circuit according to embodiments of the invention.
Figure 1B:
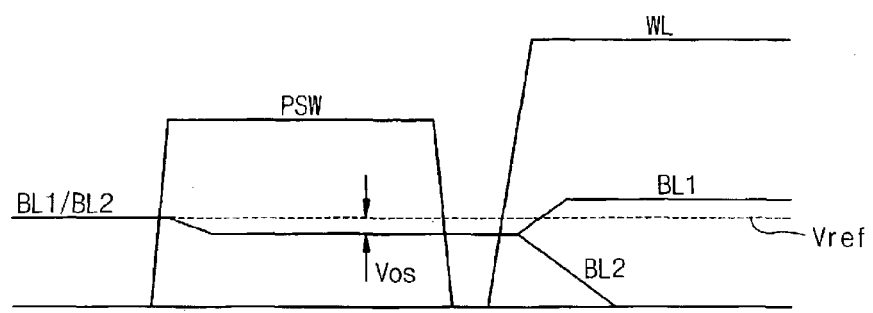
FIG. 1B is a timing diagram illustrating the voltage levels of the offset-compensated amplifier circuit of FIG. 1A.

FIG. 1A is a functional block diagram of an offset-compensated amplifier circuit according to embodiments of the invention. FIG. 1B is a diagram illustrating the voltage levels of the offset-compensated amplifier circuit of FIG. 1A.

According to embodiments of the invention, an offset-compensated amplifier circuit removes its own offset voltage using a negative feedback method, and determines a voltage of the second bit line in response to voltage variation of the first bit line. Herein, the first bit line is a true bit line that is connected to a selected memory cell, and the second bit line is a complementary bit line that is used as a reference bit line. Conversely, the second bit line may be a true bit line and the first bit line may be a complementary bit line.

Referring to FIG. 1A, the offset-compensated amplifier circuit includes a differential amplifier AMP and a switch SW. The differential amplifier AMP has the first input terminal (or a non-inverting input terminal) supplied with a reference voltage Vref, the second input terminal (or an inverting input terminal) connected to a bit line BL1, and an output terminal connected to a bit line BL2. The switch SW is connected between the output terminal of the differential amplifier AMP and the bit line BL1, and is switched on/off according to a control signal PSW.

In this embodiment, the reference voltage Vref is equal to a bit line precharge voltage VCCA/2. However, the reference voltage Vref can be established lower or higher than the bit line precharge voltage VCCA/2. The VCCA indicates a power supply voltage for an array.

The differential amplifier AMP is a current mirror amplifier and has an input offset voltage. If a varied voltage of the true bit line is equal to or lower than an input offset voltage, the differential amplifier AMP does not correctly recognize the voltage variation of the true bit line. The offset-compensated amplifier circuit of the embodiment removes an input offset voltage of the differential amplifier AMP with respect to the reference voltage Vref using a negative feedback loop, and securely detects voltage variation of the true bit line irrespective of the input offset voltage.

Assume that the bit lines BL1 and BL2 are precharged with a bit line precharge voltage (for example, VCCA/2) via a bit line precharge circuit (not shown). As the control signal PSW is activated, the output terminal of the differential amplifier AMP is electrically connected to the second input terminal thereof via the switch SW. That is, a negative feedback loop is formed at the differential amplifier AMP. In accordance with the negative feedback loop, as illustrated in FIG. 1B, an offset voltage Vos of the differential amplifier AMP with respect to the reference voltage Vref appears at its output terminal. As the voltage of the output terminal is changed as much as the offset voltage Vos, the differential amplifier AMP recognizes voltages Vref and VBL of the first and second input terminals (+, −) as the same value. This means that the offset voltage Vos of the differential amplifier AMP is removed with respect to the reference voltage Vref or that the offset voltage Vos of the differential amplifier AMP is compensated with respect to the reference voltage Vref. An offset-removed voltage is temporarily stored on the bit lines BL1 and BL2. When the offset voltage Vos of the differential amplifier AMP is compensated, as shown in FIG. 1B, voltages of the bit lines BL1 and BL2 are changed as much as the offset voltage Vos as compared with a bit line precharge voltage (or a reference voltage Vref).

Afterwards, the control signal PSW is inactivated before row activation, so that the output terminal of the differential amplifier AMP is electrically isolated from the second input terminal (or the inverting input terminal). As the word line WL is activated, the voltage of the true bit line (for example, BL1) is changed through a charge sharing process. The differential amplifier AMP drives a complementary bit line (for example, BL2) in response to voltage variation of the true bit line. Namely, the differential amplifier AMP senses and amplifies a difference between the reference voltage Vref and the varied voltage of the true bit line, and outputs the amplified voltage onto the complementary bit line. Since a voltage difference between the bit lines BL1 and BL2 is first sensed and amplified by the offset-compensated amplifier circuit, a flip-flop sense amplifier can sense an amplified voltage difference between the bit lines BL and BLB irrespective of its own offset voltage.

Figure 2:
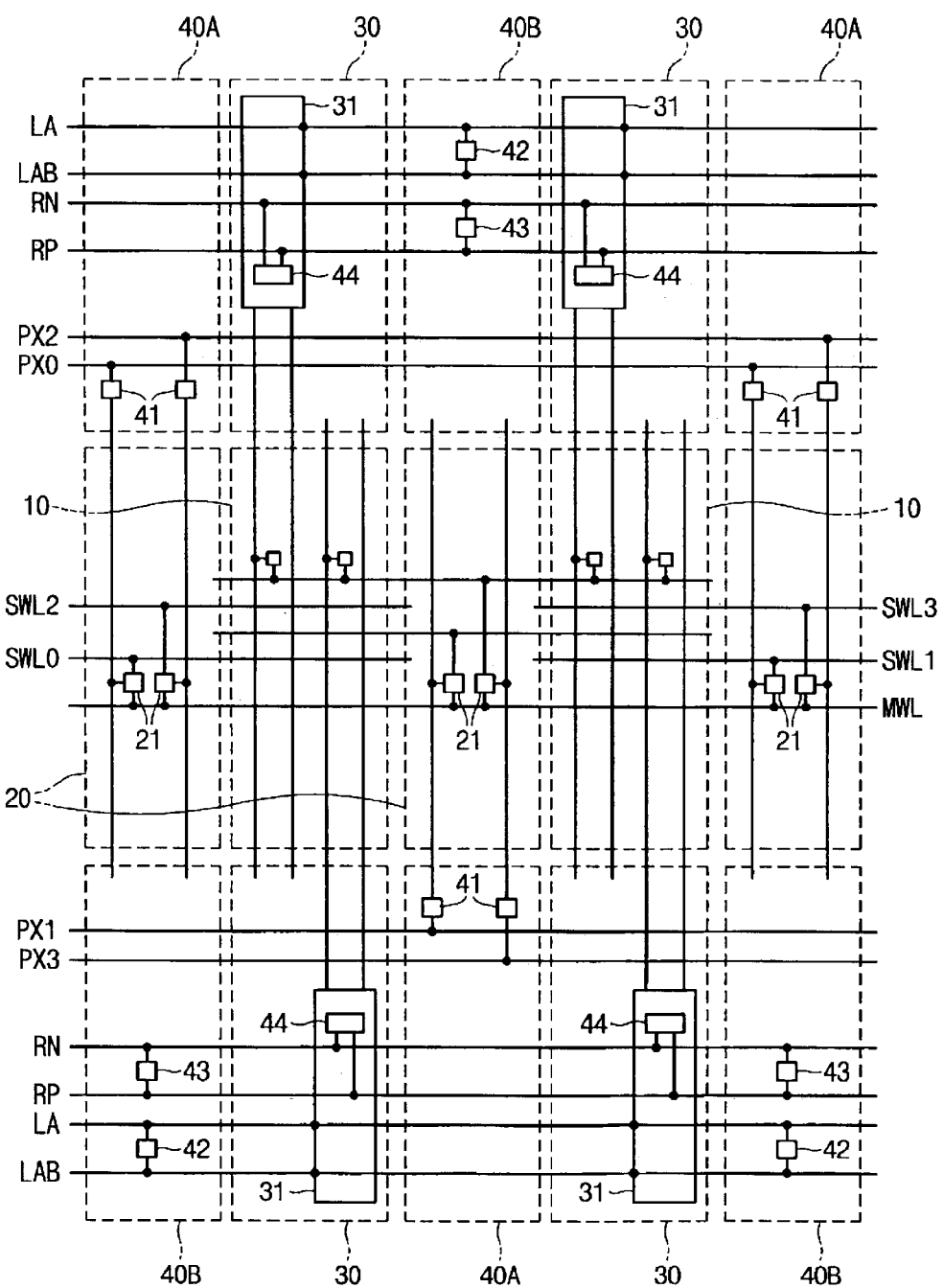
FIG. 2 is a block diagram of a semiconductor memory device including an offset-compensated amplifier circuit according to an embodiment of the invention.

FIG. 2 illustrates a DRAM semiconductor memory device including an offset-compensated amplifier circuit according to an embodiment of the invention. The DRAM device of FIG. 2 has hierarchical word line and shared sense amplifier structures. Referring to FIG. 2, the semiconductor memory device includes a number of memory cell regions 10 having corresponding memory blocks. In each memory block, a number of memory cells (e.g., DRAM cells) are arranged in a matrix of rows (or sub word lines) and columns (or bit lines). Sub word line driver regions 20 are disposed between memory cell regions 10 in each row. Each of the sub word line driver regions 20 includes sub word line decoders 21 for driving sub word lines of a corresponding memory block. A number of sense amplification regions 30 are on the sides of the memory cell regions 10 in the bit line direction. At each of the sense amplification regions 30, several sense amplifiers 31 are connected to corresponding bit line pairs, respectively. Each of the sense amplifiers 31 will be fully described hereinafter. Conjunction regions 40 are situated at both sides of each of the sub word line driver regions 20 in the bit line direction. In this embodiment, the conjunction regions 40 are divided into two groups. The first group of conjunction regions 40A includes drivers 41 for transferring corresponding drive signals PXi to sub word line decoders 21, and the second group of conjunction regions 40B includes drivers 42 for driving corresponding sense amplifiers 31. Drivers 42 in the same row are connected in common to signal lines LA and LAB, as shown in FIG. 2.

Still referring to FIG. 2, voltage generators 43 are illustrated at the conjunction regions 40B of the second group, respectively. Each of the voltage generators 43 is a part of the offset-compensated amplifier circuit described in FIG. 1 and generates a bias voltage. The other voltage generator 44 (refer to FIG. 3, an inverting amplifier MP5 and MN22 and a switch MN21) of the offset-compensated amplifier circuit is shown at each of the sense amplification regions 30. Voltage generators 43 in the same row are connected in common to signal lines RN and RP. The signal line RP is used to transfer a bias voltage that is generated from each of the voltage generators 43, and the signal line RN is used to provide a discharge path during an interval of time when the bias voltage is generated. This will be fully described hereinafter.

Figure 3:
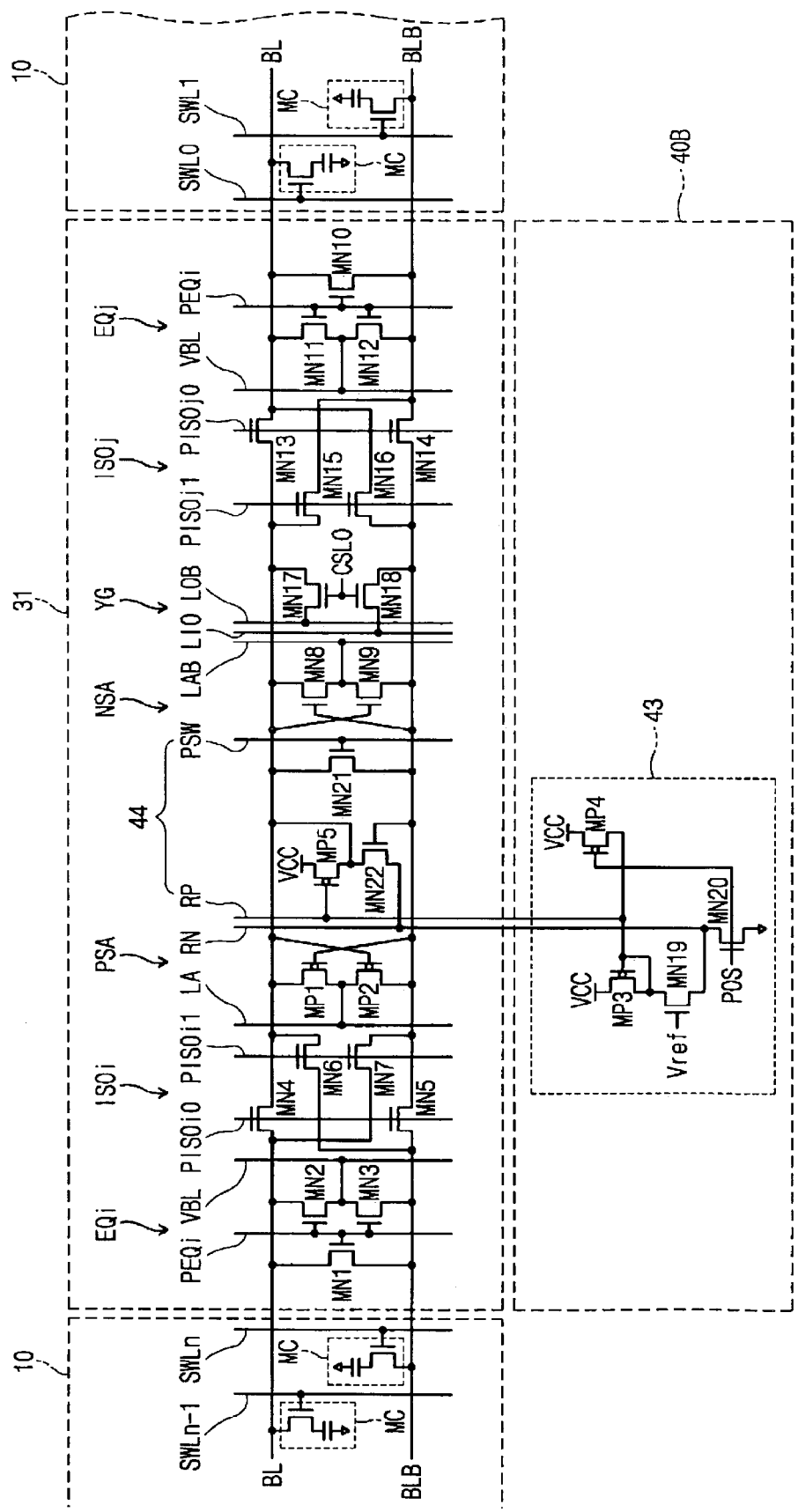
FIG. 3 is a circuit diagram of an offset-compensated amplifier circuit and a sense amplifier circuit structured to operate with the amplifier circuit of FIG. 2.

FIG. 3 is a circuit diagram that illustrates in further detail the offset-compensated amplifier circuit according to embodiments of the invention. Referring to FIG. 3, a sense amplifier circuit 31 is shared by memory blocks 10, and includes first and second bit line equalizers EQi and EQj, a P-latch sense amplifier PSA, an N-latch sense amplifier NSA, first and second bit line isolators ISOi and ISOj, and a column pass gate YG. The first bit line equalizer EQi is formed of three NMOS transistors MN1, MN2, and MN3, which precharges and equalizes bit lines BL and BLB of a left-handed memory block 10 in response to a control signal PEQi. The first bit line isolator ISOi is formed of four NMOS transistors MN4–MN7, and connects/isolates the sense amplifier circuit 31 to/from the left-handed memory block 10 in response to control signals PISi0 and PISOi1.

Still referring to refer to FIG. 3, the P-latch sense amplifier PSA is formed of two PMOS transistors MP1 and MP2, and connects either one (a bit line having a relatively high voltage) of paired bit lines BL and BLB of a selected memory block to a signal line LA. The N-latch sense amplifier NSA is formed of two NMOS transistors MN8 an MN9, and connects the other bit line (a bit line having a relatively low voltage) to a signal line LAB. The P-latch and N-latch sense amplifiers PSA and NSA form a flip-flop sense amplifier as a main amplifier. The second bit line equalizer EQj is formed of three NMOS transistors MN10, MN11, and MN12, which precharges and equalizes bit lines BL and BLB of a right-handed memory block 10 in response to a control signal PEQj. The second bit line isolator ISOj is formed of four NMOS transistors MN13–MN16, and connects/isolates the sense amplifier circuit 31 to/from the right-handed memory block 10 in response to control signals PISj0 and PISOj1. The column pass gate YG is formed of two NMOS transistors MN17 and MN18, and electrically connects selected bit lines BL and BLB to input/output lines LIO and LIOB in response to a column select signal CSL0.

The offset-compensated amplifier circuit of this embodiment includes a differential amplifier as a current mirror amplifier and a switch. The differential amplifier is formed by PMOS transistors MP3, MP4, MP5 and NMOS transistors MN19, MN20, and MN22, and the switch is implemented by an NMOS transistor MN21. As illustrated in FIG. 3, the PMOS transistors MN3 and MP4 and the NMOS transistors MN19 and MN20 are disposed at a conjunction region 40B, and the PMOS transistor MP5 and the NMOS transistor MN22 are disposed at the sense amplification region 30. The transistors MP3, MP4, MN19, and MN20 in the conjunction region 40B form a bias voltage generator for generating a bias voltage. The transistors MP5 and MN22 in the sense amplification region 30 form an inverting amplifier for driving a complementary bit line. It should be understood that, in this embodiment, the inverting amplifier acts as the driver for a type of CMOS inverter.

The differential amplifier of the present offset-compensated amplifier circuit, as shown in FIG. 1, has the first and second input terminals (+, −) and an output terminal. The first input terminal (+) is a gate of the NMOS transistor MN19 that is supplied with a reference voltage Vref, the second input terminal (−) is a gate of the NMOS transistor MN22 that is connected to a true bit line, and the output terminal is an connection node of the transistors MP5 and MN22, that is, a complementary bit line.

In this embodiment, the PMOS and NMOS transistors MP5, MN21, and MN22 are repeated in sense amplifier circuits 31 connected to corresponding bit line pairs, so as to share the bias voltage generator 43.

Returning to FIG. 3, the PMOS transistor MP3 whose source is connected to a power supply voltage VCC has a gate and a drain connected to the first node for outputting a bias voltage, that is, a signal line RP. The NMOS transistor MN19 whose gate is connected to a reference voltage Vref has its drain connected to the signal line RP and its source connected to a signal line RN as the second node. The NMOS transistor MN20 whose gate is connected to receive a control signal POS has its current path formed between the signal line RN and a ground voltage. A gate of the PMOS transistor MP4 is connected to receive the control signal POS, and a current path thereof is formed between the power supply voltage VCC and the signal line RP.

Herein, the PMOS and NMOS transistors MP3, MP4, MN19, and MN20 form a bias voltage generator for generating a bias voltage that is used by each of inverting amplifiers (MP5 and MN22) in sense amplifier circuits 31 that are connected to corresponding bit line pairs, respectively. The offset-compensated amplifier circuit in FIG. 3 is formed by the PMOS and NMOS transistors MP5, MN21, and MN22 corresponding to each bit line pair, and the PMOS and NMOS transistors MP3, MP4, MN19, and MN20 in the conjunction region 40B.

In this embodiment the bit line isolators ISOi and ISOj perform a bit line isolation function as well as a bit line switch function. For instance, the bit line isolator corresponding to an unselected memory block electrically isolates a sense amplifier circuit 31 from a bit line pair of the unselected memory block. As a switch, the bit line isolator corresponding to a selected memory block selectively cross-couples bit lines BL and BLB of the selected memory block to a sense amplifier circuit 31.

For example, in a case where a bit line BL of a selected memory block is a complementary bit line and a bit line BLB is a true bit line or in a case where a selected memory cell is connected to BLB, a bit line isolator ISOi or ISOj connects the true bit line BLB to the second input terminal of the differential amplifier (that is, the gate of the NMOS transistor MN22) and the complementary bit line BL to the output terminal thereof (that is, the connection node of the transistors MP5 and MN22) in response to control signals (PISOi0 and PISOi1) or (PISOj0 and PISOj1). This is accomplished by inactivating the control signal PISOi1 or PISOj1 and activating the control signal PISOi0 or PISOj0.

On the other hand, when the bit line BL of the selected memory block is the true bit line and the bit line BLB is the complementary bit line, or when a selected memory cell is connected to BL, a bit line isolator ISOi or ISOj connects the true bit line BL to the second input terminal of the differential amplifier (that is, the gate of the NMOS transistor MN22) and the complementary bit line BLB to the output terminal thereof (that is, the connection node of the transistors MP5 and MN22) in response to the control signals (PISOi0 and PISOi1) or (PISOj0 and PISOj1). This is accomplished by activating the control signal PISOi1 or PISOj1 and inactivating the control signal PISOi0 or PISOj0.

Figure 4:
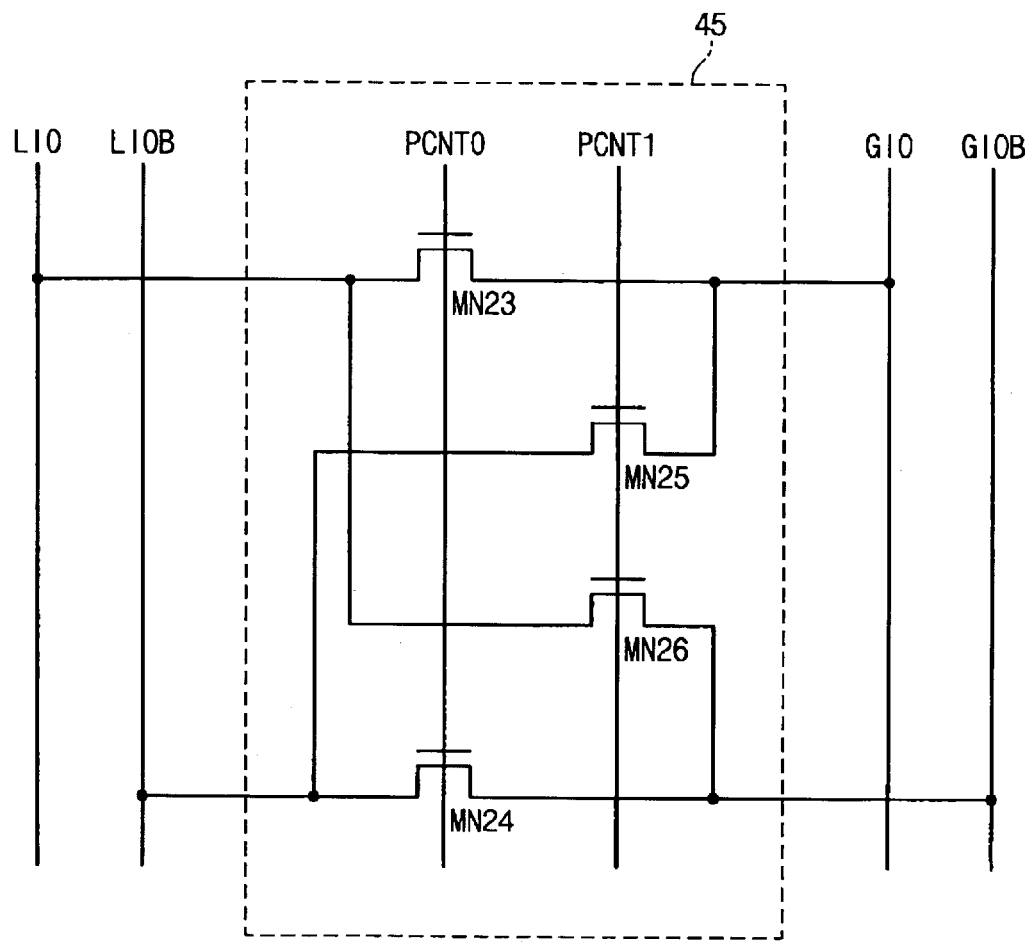
FIG. 4 is a circuit diagram for a switch circuit that switches the input/output lines of the device illustrated in FIGS. 2 and 3.

FIG. 4 is a circuit diagram for a switch circuit that switches the input/output lines of the device illustrated in FIGS. 2 and 3. As the structure for switching the true bit line to the second input terminal of the differential amplifier is used, local input/output lines LIO and LIOB are also switched in the same manner as the bit lines BL and BLB. That is, the local input/output lines LIO and LIOB, as illustrated in FIG. 4, are selectively cross-coupled to global input/output lines GIO and GIOB by a switch circuit 45. The switch circuit 45 includes four NMOS transistors MN23, MN24, MN25, and MN26. When a control signal PCNT0 is activated, the local input/output lines LIO and LIOB are connected to the global input/output lines GIO and GIOB in this order. When a control signal PCNT1 is activated, the local input/output lines LIO and LIOB are connected to the global input/output lines GIOB and GIO in this order. That is, when the control signal PCNT1 is activated, the local input/output lines LIO and LIOB are cross-coupled to the global input/output lines GIO and GIOB, respectively.

In this embodiment, the control signals PISOi0, PISOi1, PISOj0, PISOj1, PCNT0, and PCNT1 are controlled to be selectively activated according to an LSB address bit RA0 of a row address. The reason for this is that, in this embodiment, the second input terminal (that is, the gate of MN22) of the differential amplifier in FIG. 3 is always connected to a true bit line. Whether an odd-numbered/even-numbered one of sub word lines SWL0–SWLn in a selected memory block is selected is determined by the LSB address bit. In a case where an even-numbered sub word line (e.g., SWL0) is selected, a bit line BL is a true bit line and a bit line BLB is a complementary bit line. At this time, while control signals PISOi0/PISOj0 and PCNT0 are activated, control signals PISOi1/PISOj1 and PCNT1 are inactivated. In a case where an odd-numbered sub word line (e.g., SWL1), a bit line BL is a complement bit line and a bit line BLB is a true bit line. At this time, while control signals PISOi0/PISOj0 and PCNT0 are inactivated, control signals PISOi1/PISOj1 and PCNT1 are activated.

Figure 5:
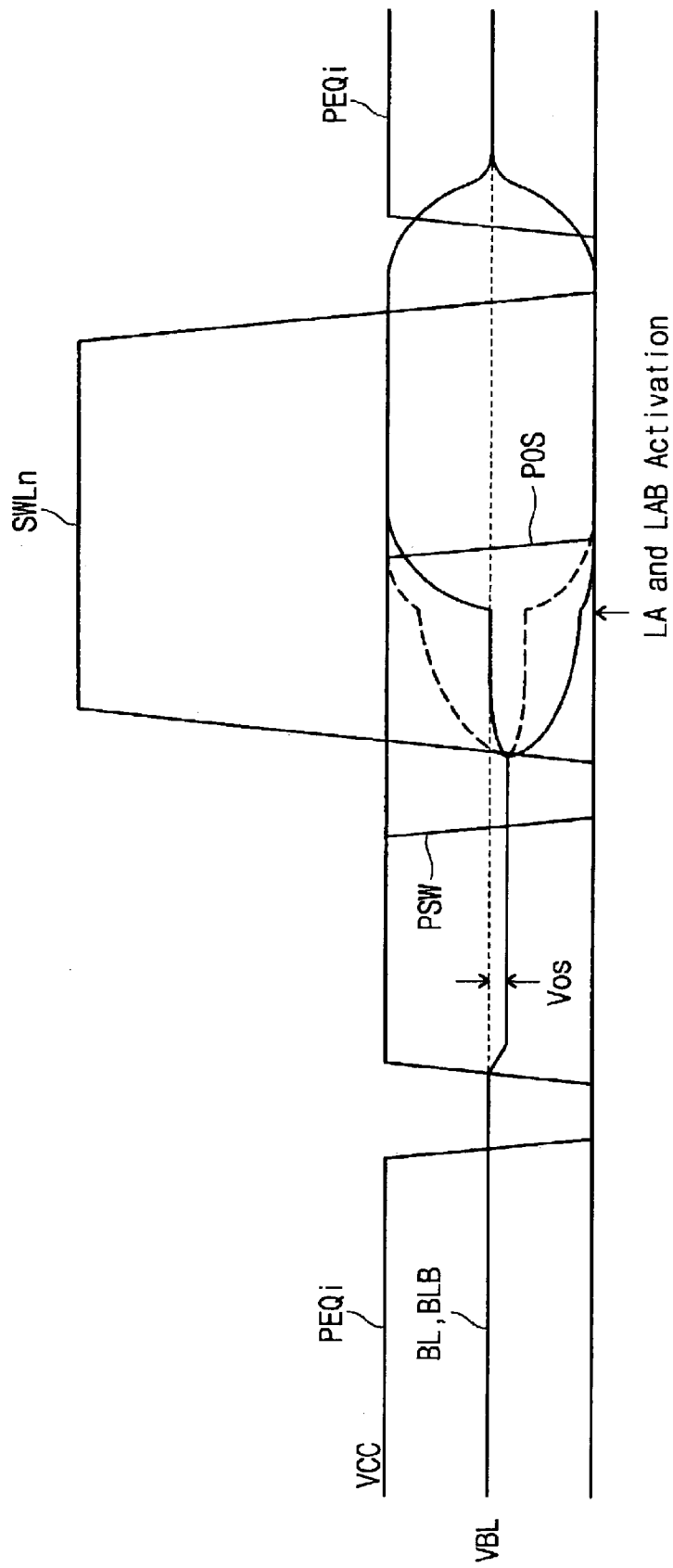
FIG. 5 is a timing diagram for a read operation of a semiconductor memory device according to embodiments of the invention.

FIG. 5 is a timing diagram for a read operation of a semiconductor memory device according to embodiments of the invention. Prior to description of the read operation, assume that a sub word line SWLn of the left-handed memory block 10 in FIG. 3 is selected. This means that the bit line BLB is a true bit line and the bit line BL is a complementary bit line.

To begin with, as a control signal PEQi is activated, the bit lines BL and BLB are precharged with a precharge voltage VBL by the bit line equalizer PEQi. Before row activation, as illustrated in FIG. 5, control signals PSW and POS are simultaneously activated. This enables the offset-compensated amplifier circuit to operate. More detailed description is as follows.

With reference to FIGS. 1, 3, and 5, as the control signal POS is activated, an NMOS transistor MN20 of a bias voltage generator 43 in a conjunction region 40B is turned on. A bias voltage is generated on a signal line RP according to a reference voltage Vref, and a discharge path is provided to an inverting amplifier via a signal line RN. An NMOS transistor MN21 electrically connects the second input terminal of a differential amplifier AMP to an output terminal thereof in response to activation of the control signal PSW. That is, a negative feedback loop is formed at the differential amplifier AMP. As a result of the negative feedback loop, an offset voltage Vos of the differential amplifier AMP appears at the output terminal thereof with respect to a reference voltage Vref. As the voltage of the output terminal is lowered as much as the offset voltage Vos, the differential amplifier AMP recognizes voltages of its input terminals (+, −) as the same value. This means that the offset voltage Vos of the differential amplifier AMP is removed or that it is compensated. As the offset voltage Vos of the differential amplifier AMP is compensated with respect to the reference voltage Vref, precharge voltages of the bit lines BL and BLB are lowered as much as the offset voltage Vos. Then, the control signal PSW is inactivated before row activation, that is, before a sub word line SWLn is activated.

As the sub word line SWLn is activated, a voltage of the true bit line BLB is changed according to data stored in a selected memory cell MC. For example, when a voltage of the true bit line BLB increases, the excess current is discharged through the discharge path that is formed by the NMOS transistor MN22, the signal line RN, and the NMOS transistor MN20. This means that a voltage of the output terminal of the differential amplifier (or of the complementary bit line BL) is rapidly lowered. In other words, the differential amplifier AMP senses and amplifies a difference between the reference voltage Vref and a changed voltage of the true bit line BLB, and outputs the amplified voltage onto the complementary bit line BL. Thus, a voltage difference between the bit lines BL and BLB, as illustrated in FIG. 5, is sufficiently amplified via the offset-compensated amplifier circuit.

After the voltage difference is amplified by the offset-compensated amplifier circuit, a flip-flop sense amplifier (PSA and NSA) senses and amplifies a voltage difference between the bit lines BL and BLB in response to activation of LA and LAB signals. That is, a P-latch sense amplifier PSA connects a bit line of a relatively high voltage to a signal line LA of a power supply voltage VCC and a bit line of a relatively low voltage to a signal line LAB of a ground voltage VSS. This means that the flip-flop sense amplifier can sense an amplified difference voltage between the bit lines BL and BLB irrespective of its own offset voltage. That is, although the voltage induced on the bit line via charge sharing is lower than an offset voltage of the flip-flop sense amplifier, the flip-flop sense amplifier can sense the voltage difference between the bit lines BL and BLB, irrespective of its own offset voltage, because the present offset-compensated amplifier circuit senses and amplifies the minute voltage variation of the true bit line. Afterward, the sub word line SWLn is inactivated, and the bit lines BL and BLB are precharged with the precharge voltage VBL.

Figure 6A:
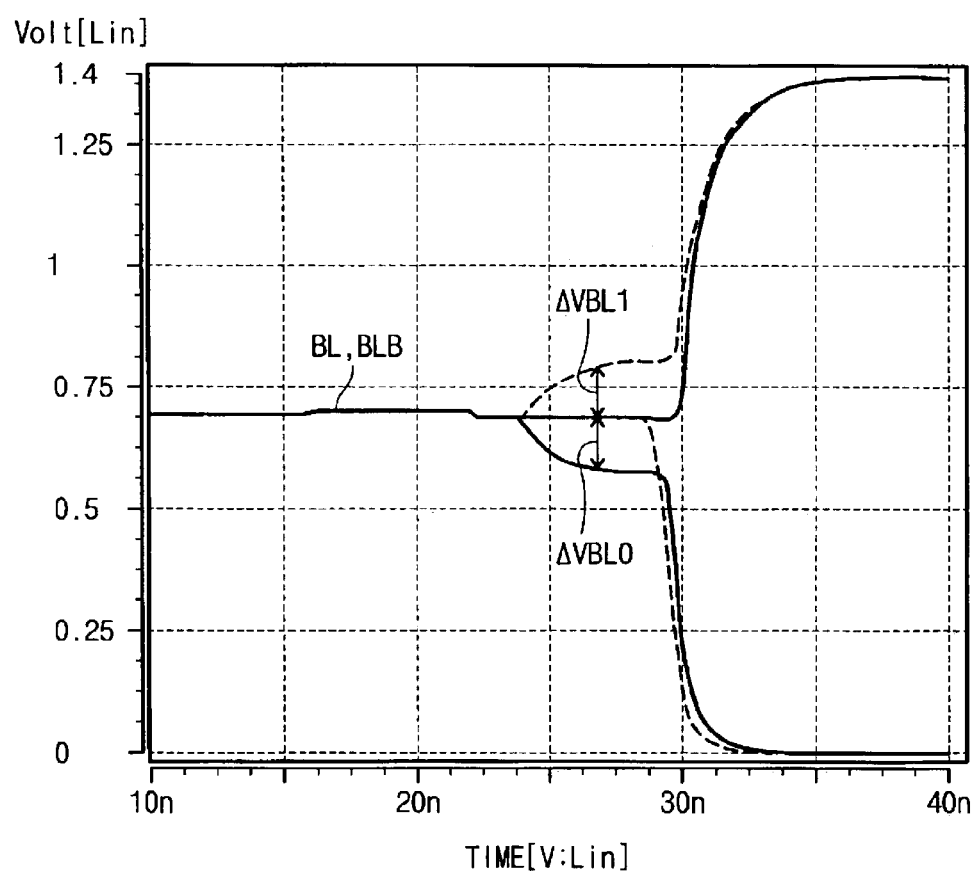
FIG. 6A is a graph of the voltage variation between bit lines in a conventional semiconductor memory device in the case where no offset voltage exists in a flip-flop sense amplifier.

FIG. 6A is a graph of the voltage variation between bit lines BL and BLB in a conventional semiconductor memory device having no offset voltage in a flip-flop sense amplifier. As shown in FIG. 6A, a very small voltage difference DVBL0 or DVBL1 between the bit lines BL and BLB is normally sensed and amplified by the offset-free sense amplifier.

Figure 6B:
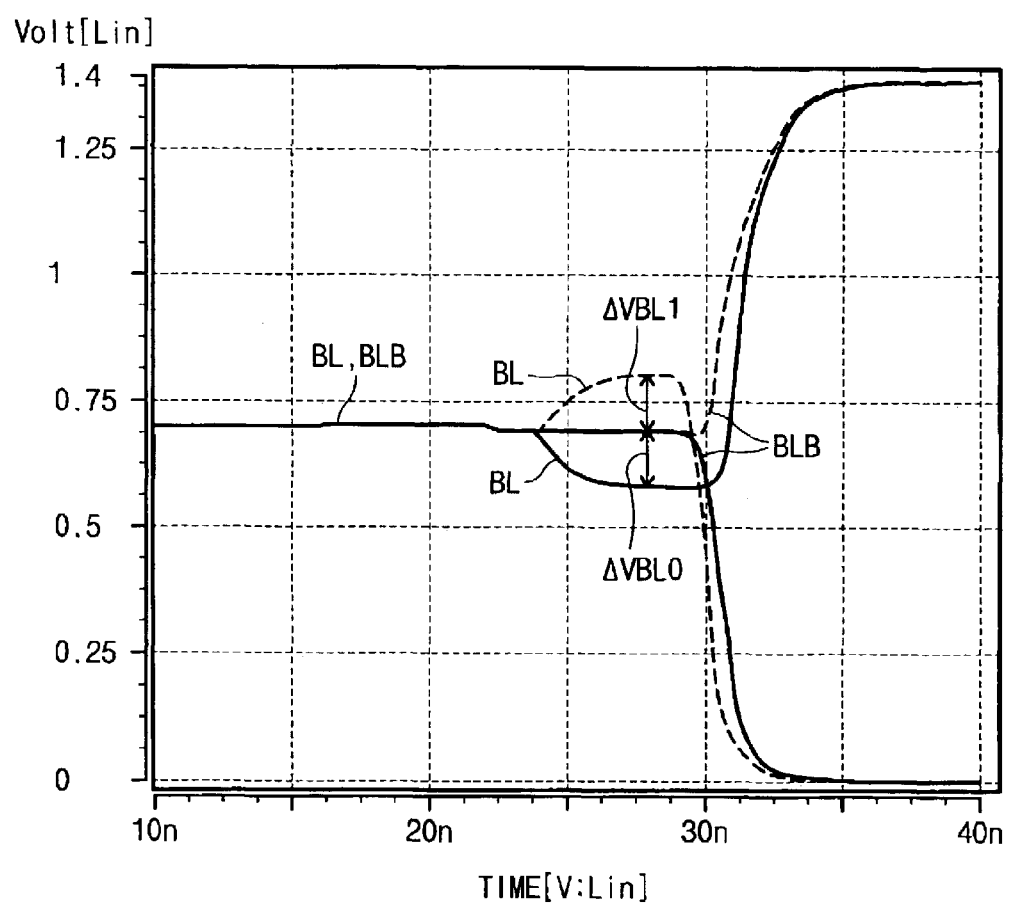
FIG. 6B is a graph of the voltage variation between bit lines in a conventional semiconductor memory device in the case where an offset voltage exists in a flip-flop sense amplifier.

FIG. 6B is a graph of the voltage variation between bit lines BL and BLB in a conventional semiconductor memory device having an offset voltage in a flip-flop sense amplifier. An abnormal operation arises when the induced voltage of the true bit line is lower than the offset voltage of the flip-flop sense amplifier. For example, although the voltage of the true bit line BL is higher/lower than a precharge voltage VBL, as illustrated in FIG. 6B, owing to the offset voltage of the flip-flop sense amplifier, the voltage of the true bit line BL goes to a ground voltage/a power supply voltage and the voltage of the complementary bit line BLB goes to the power supply voltage/the ground voltage. That is, cell data is not read out exactly, owing to the offset voltage of the flip-flop sense amplifier.

Figure 7A:
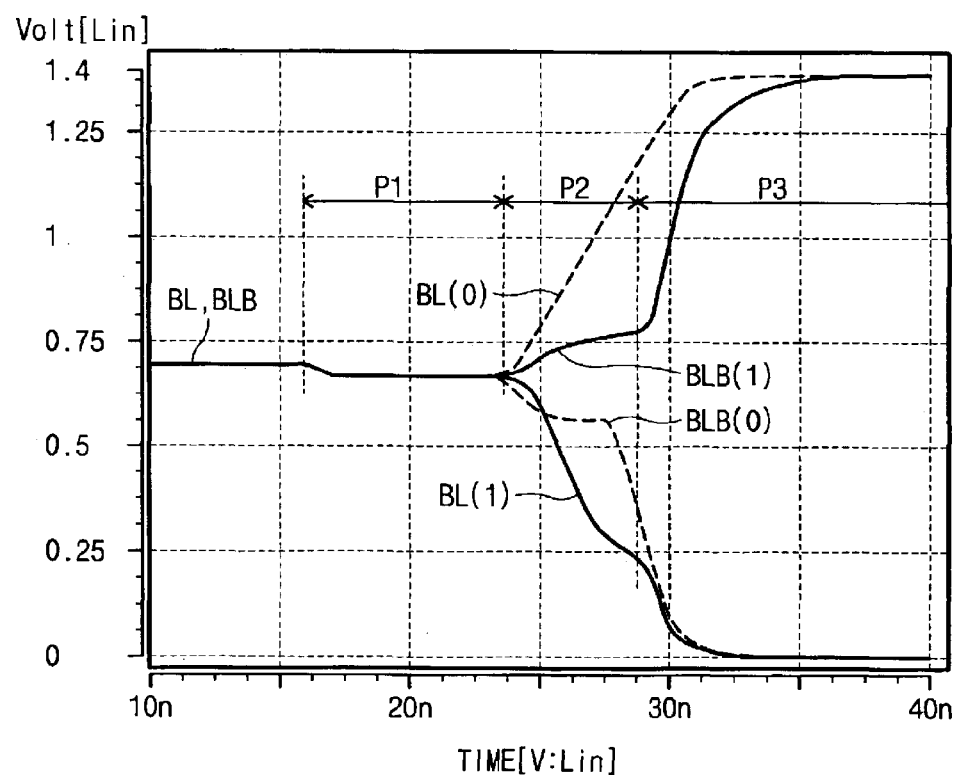
FIG. 7A is a graph of the voltage variation between bit lines in embodiments of the invention for the case where no offset voltage exists in the differential amplifier.

FIG. 7A is a graph of the voltage variation between bit lines BL and BLB in an embodiment of the invention having no offset voltage in the differential amplifier. In the case of utilizing an offset-compensated amplifier circuit according to embodiments of the present invention, a read operation is divided into an offset compensation period P1, the first sense amplification period P2, and the second sense amplification period P3. Since a negative feedback loop is formed at a differential amplifier of the present offset-compensated amplifier circuit during the offset compensation period P1, an offset voltage of the differential amplifier is removed. In the case of FIG. 7A, since the differential amplifier has no offset voltage, the voltages of the bit lines BL and BLB are the same during offset compensation period P1. A sub word line is activated in the first sense amplification period P2, so that a voltage of a true bit line is increased or decreased according to cell data. At this time, the differential amplifier of the offset-compensated amplifier circuit drives a complementary bit line in response to the voltage variation of the true bit line. The complementary bit line is driven in the opposite direction to the voltage of the true bit line. Since the offset voltage of the differential amplifier is compensated, the differential amplifier exactly senses the voltage variation of the true bit line. In the second sense amplification period P3, a flip-flop sense amplifier senses and amplifies the voltage difference between the bit lines BL and BLB in a normal manner.

Figure 7B:
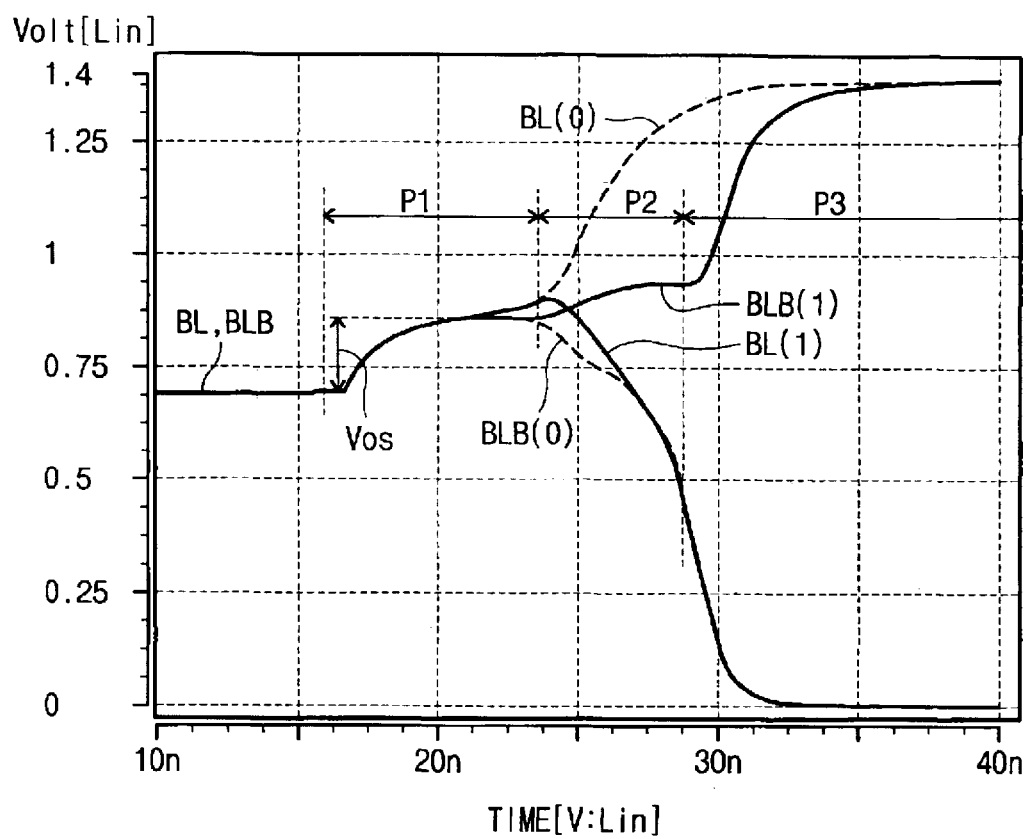
FIGS. 7B and 7C are graphs of the voltage variation between bit lines in embodiments of the invention where an offset voltage exists in the differential amplifier.

FIG. 7B is a graph of the voltage variation between bit lines BL and BLB in an embodiment of the invention when an offset voltage exists in the differential amplifier. As set forth above, a read operation of this embodiment is roughly divided into an offset compensation period P1, a first sense amplification period P2, and a second sense amplification period P3. As a negative feedback loop is formed by the differential amplifier of the offset-compensated amplifier circuit in the offset compensation period P1, the offset voltage of the differential amplifier is removed. In the case where the reference voltage Vref of the differential amplifier is elevated by an offset voltage Vos, the voltages of the bit lines BL and BLB are increased by the offset voltage Vos, as illustrated in FIG. 7B. That is, an offset voltage of the differential amplifier is compensated with respect to the reference voltage Vref. A sub word line is activated in the first sense amplification period P2, so that the voltage of the true bit line is changed according to cell data. At this time, the differential amplifier of the offset-compensated amplifier circuit drives a complementary bit line in response to the voltage variation of the true bit line. The complementary bit line is driven in the opposite direction to the voltage of the true bit line. Since the offset voltage of the differential amplifier is compensated, the differential amplifier accurately senses the voltage variation of the true bit line. In the second sense amplification period P3, a flip-flop sense amplifier senses and amplifies the voltage difference between the bit lines BL and BLB in a normal manner.

Figure 7C:
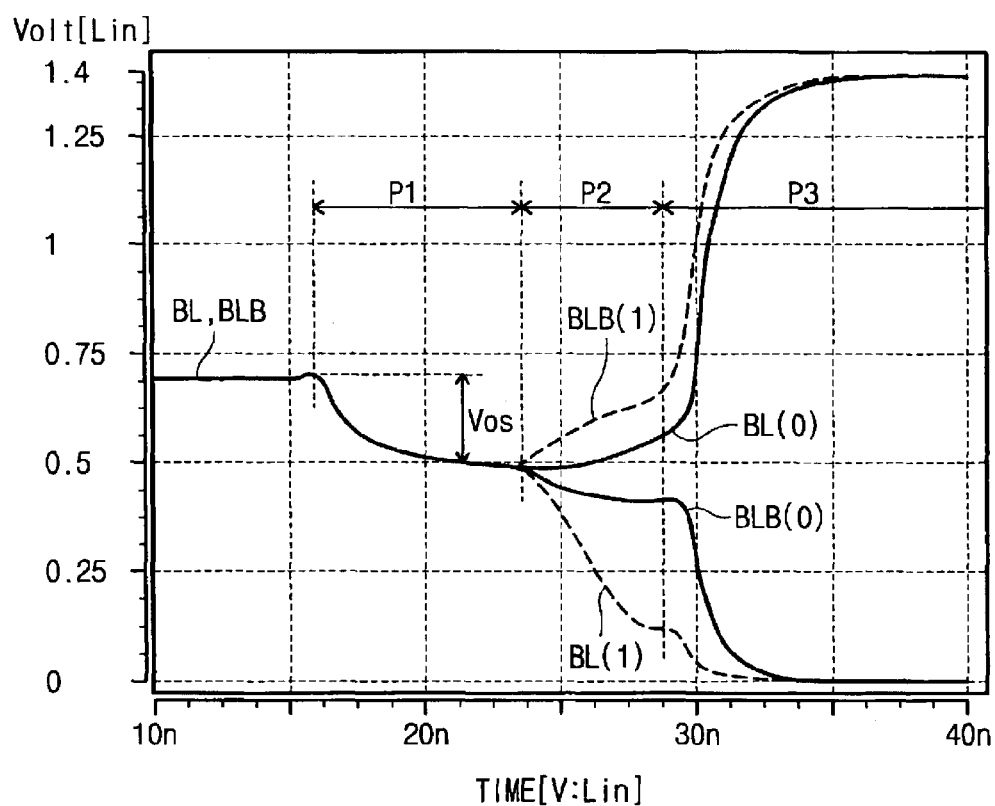

FIG. 7C is a graph of the voltage variation between bit lines BL and BLB in an embodiment of the invention when an offset voltage exists in the differential amplifier. Because a negative feedback loop is formed by the differential amplifier of the offset-compensated amplifier circuit in the offset compensation period P1, the offset voltage of the differential amplifier is removed. In the case where the reference voltage Vref of the differential amplifier is lowered by the offset voltage Vos, voltages of bit lines BL and BLB are decreased by the offset voltage Vos, as illustrated in FIG. 7C. A sub word line is activated in the first sense amplification period P2, so that the voltage of the true bit line is changed according to cell data. At this time, the differential amplifier of the offset-compensated amplifier circuit drives a complementary bit line in response to the voltage variation of the true bit line. The complementary bit line is driven in the opposite direction to the voltage variation of the true bit line. Since the offset voltage of the differential amplifier is compensated, the differential amplifier accurately senses the voltage variation of the true bit line. In the second sense amplification period P3, a flip-flop sense amplifier senses and amplifies a voltage difference between the bit lines BL and BLB in a normal manner.

Figure 8A:
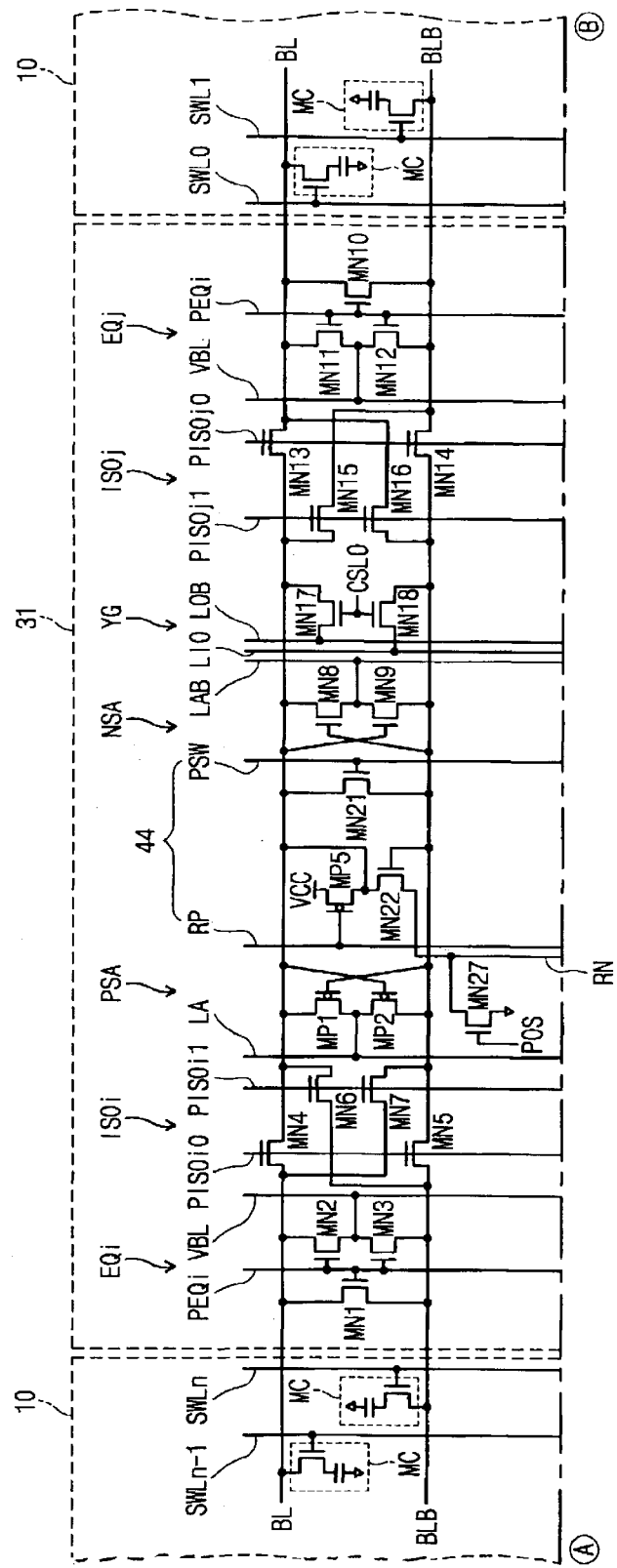
FIGS. 8A and 8B are circuit diagrams of an offset-compensated amplifier circuit and a sense amplifier circuit according to another embodiment of the invention.
Figure 8B:
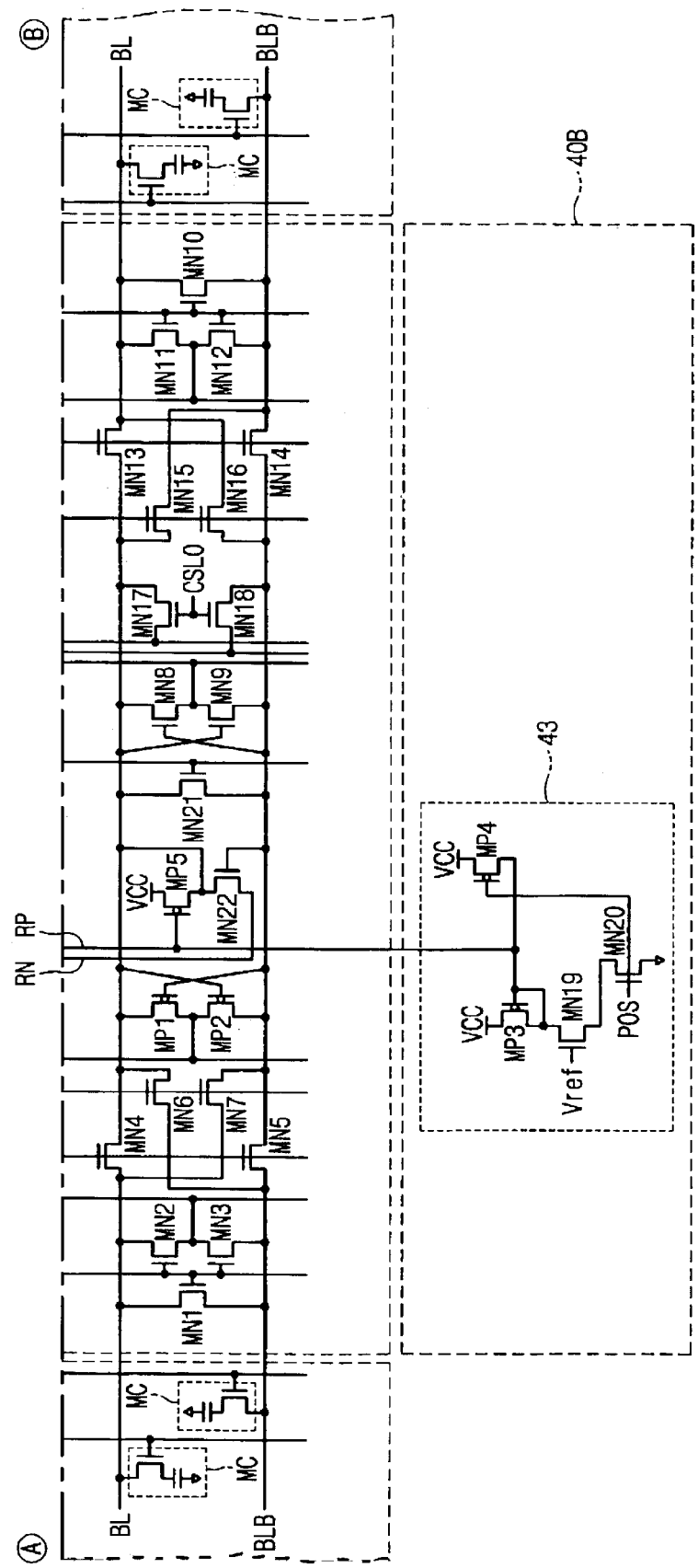

FIGS. 8A and 8B, which are connected along the line AB, are circuit diagrams of an offset-compensated amplifier circuit and a sense amplifier circuit according to another embodiment of the present invention. A semiconductor memory device of this embodiment is similar to that of the earlier-described embodiment except that an NMOS transistor MN27 for providing a discharge path is added to every column select unit. A complete description of this embodiment will be omitted for brevity's sake. In this embodiment, unlike the signal line RP, the signal line RN is not disposed continuously along a row direction, but is separated in every column select unit (or redundancy unit). Each of the separated signal lines RN is selectively connected to a ground voltage via a corresponding NMOS transistor MN27.

Figure 9:
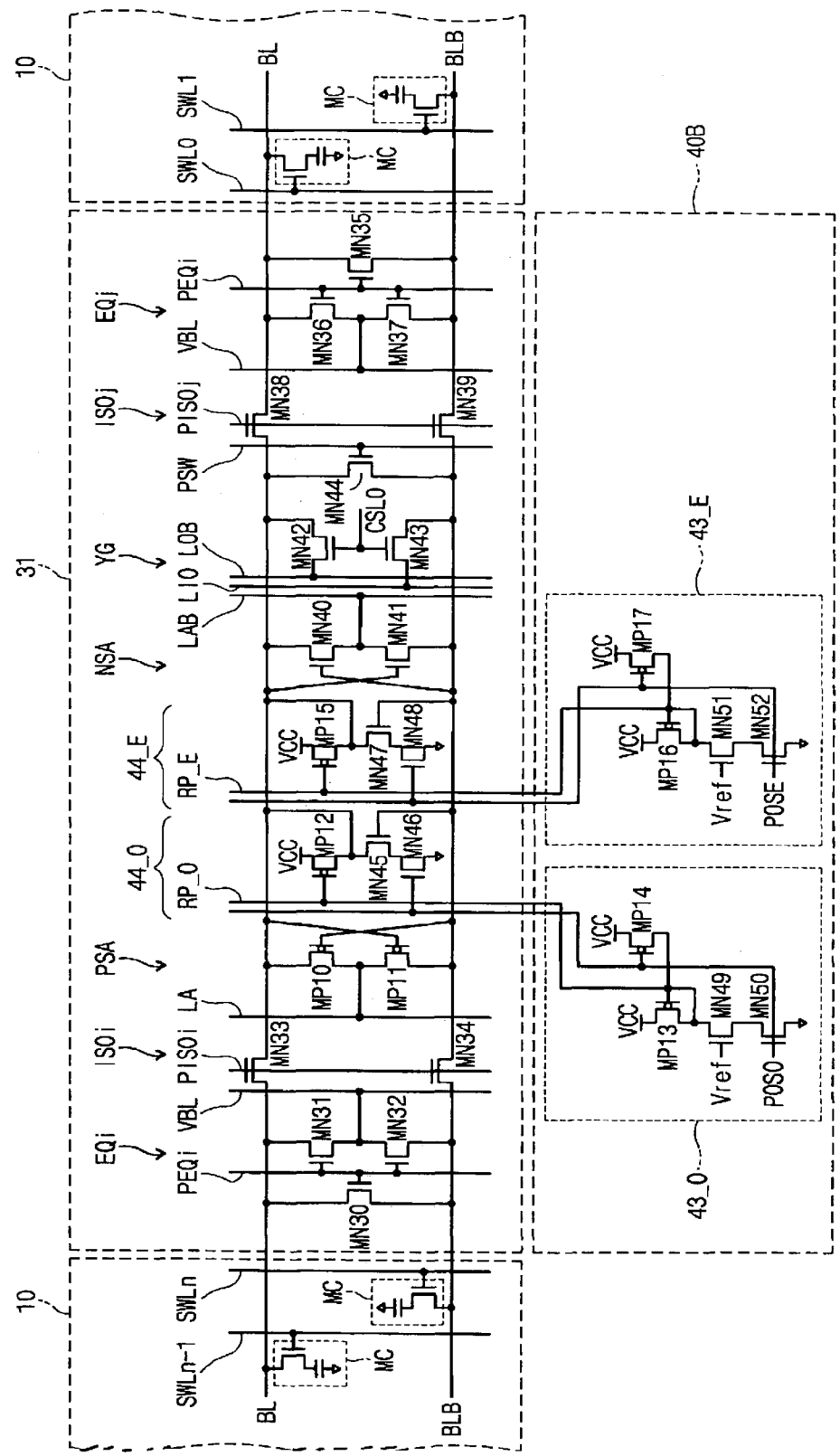
FIG. 9 is a circuit diagram of an offset-compensated amplifier circuit and a sense amplifier circuit according to yet another embodiment of the present invention.

FIG. 9 is a circuit diagram of an offset-compensated amplifier circuit and a sense amplifier circuit according to yet another embodiment of the invention.

Referring to FIG. 9, a sense amplifier circuit 31 of the present invention is shared by memory blocks 10, and includes the first and second bit line equalizers EQi and EQj, a P-latch sense amplifier PSA, an N-latch sense amplifier NSA, the first and second bit line isolators ISOi and ISOj, and a column pass gate YG. The circuits PSA, NSA, and YG in FIG. 9 are identical to those illustrated in FIG. 3, thus another description of them will be omitted. Unlike the first and second bit line isolators ISOi and ISOj in FIG. 3, the first and second bit line isolators ISOi and ISOj in FIG. 9 have no bit line switch function. For this reason, the semiconductor memory device of FIG. 9 does not need a switch circuit 45 as illustrated in FIG. 4. That is, the first and second bit line isolators ISOi and ISOj in FIG. 9 only possess a bit line isolation function, which will be fully described below.

While the memory device of FIG. 3 uses a bit line switch structure, the memory device of FIG. 9 includes an offset-compensated amplifier circuit that is implemented using two differential amplifiers (43_O and 44_O) and (43_E and 44_E) and one switch MN44. One of the differential amplifiers operates when the bit line BL is the true bit line, and the other thereof operates when the bit line BLB is the true bit line. For example, the first differential amplifier (43_O and 44_O) operates when the bit line BLB is the true bit line, and the second differential amplifier (43_E and 44_E) operates when the bit line BL is the true bit line. That is, the first and second differential amplifiers operate exclusively of each other.

The first differential amplifier includes a bias voltage generator 43_O and an inverting amplifier 44_O. The bias voltage generator 43_O includes two NMOS transistors MN49 and MN50 and two PMOS transistors MP13 and MP14, which are disposed at a conjunction region 40B. The PMOS transistor MP13, whose source is connected to a power supply voltage VCC, has its gate and drain commonly connected to the first node for outputting a bias voltage, that is, the signal line RP_O. Current paths of the NMOS transistors MN49 and MN50 are formed in series between the signal line RP_O and a ground voltage. A reference voltage Vref is applied to a gate of the NMOS transistor MN49, and a control signal POSO is applied to a gate of the NMOS transistor MN50. The PMOS transistor MP14, whose gate is connected to the signal line POSO, has its current path formed between the power supply voltage VCC and the signal line RP_O.

The inverting amplifier 44_O includes one PMOS transistor MP12 and two NMOS transistors MN45 and MN46, which are disposed at a sense amplification region 30 where the sense amplifier circuit 31 is disposed. The PMOS transistor MP12, whose gate is connected to a signal line RP_O, has its current path formed between the power supply voltage VCC and a complementary bit line as an output terminal of the first differential amplifier. Current paths of the NMOS transistors MN45 and MN46 are formed in series between the output terminal of the differential amplifier (that is, the complementary bit line) and the ground voltage. A gate of the NMOS transistor MN45 is connected to the true bit line as the second input terminal of the first differential amplifier, and a gate of the NMOS transistor MN46 is connected to the control signal POSO.

The second differential amplifier includes a bias voltage generator 43_E and an inverting amplifier 44_E. The bias voltage generator 43_E includes two PMOS transistors MP16 and MP17 and two NMOS transistors MN51 and MN52, which are disposed at the conjunction region 40B. The PMOS transistor MP16, whose source is connected to the power supply voltage VCC, has its gate and drain commonly connected to the first node for outputting a bias voltage, that is, a signal line RP_E. Current paths of the NMOS transistors MN51 and MN52 are formed in series between the signal line RP_E and the ground voltage. The reference voltage Vref is applied to a gate of the NMOS transistor MN51, and a control signal POSE is applied to a gate of the NMOS transistor MN52. The PMOS transistor MP17 whose gate is connected to the signal line POSE has its current path formed between the power supply voltage VCC and the signal line RP_E.

The inverting amplifier 44_E includes one PMOS transistor MP15 and two NMOS transistors MN47 and MN48, which are disposed at the sense amplification region 30 where the sense amplifier circuit 31 is disposed. The PMOS transistor MP15, whose gate is connected to the signal line RP_E, has its current path formed between the power supply voltage VCC and a complementary bit line as an output terminal of the second differential amplifier. Current paths of the NMOS transistors MN47 and MN48 are formed in series between the output terminal of the second differential amplifier and the ground voltage. A gate of the NMOS transistor MN47 is connected to the true bit line as the second input terminal of the second differential amplifier, and a gate of the NMOS transistor MN48 is connected to the control signal POSE.

In this embodiment, when an even-numbered one (e.g., SWL0, SWL2, SWL4, . . . , SWLn-1) of sub word lines SWL0–SWLn in a selected memory block is selected, a bit line (e.g., BL) is the true bit line and a bit line (e.g., BLB) is the complementary bit line. At this time, the control signal POSE is activated and the control signal POSO is inacti-vated. This means that an offset-compensated amplifier circuit having the second differential amplifier (43_E and 44_E) operates. The control signals POSO and POSE are selectively activated according to an LSB address bit of a row address. Except for this point, the semiconductor memory device in FIG. 9 operates the same as that in FIG. 3, and further description will be omitted.

Figure 10:
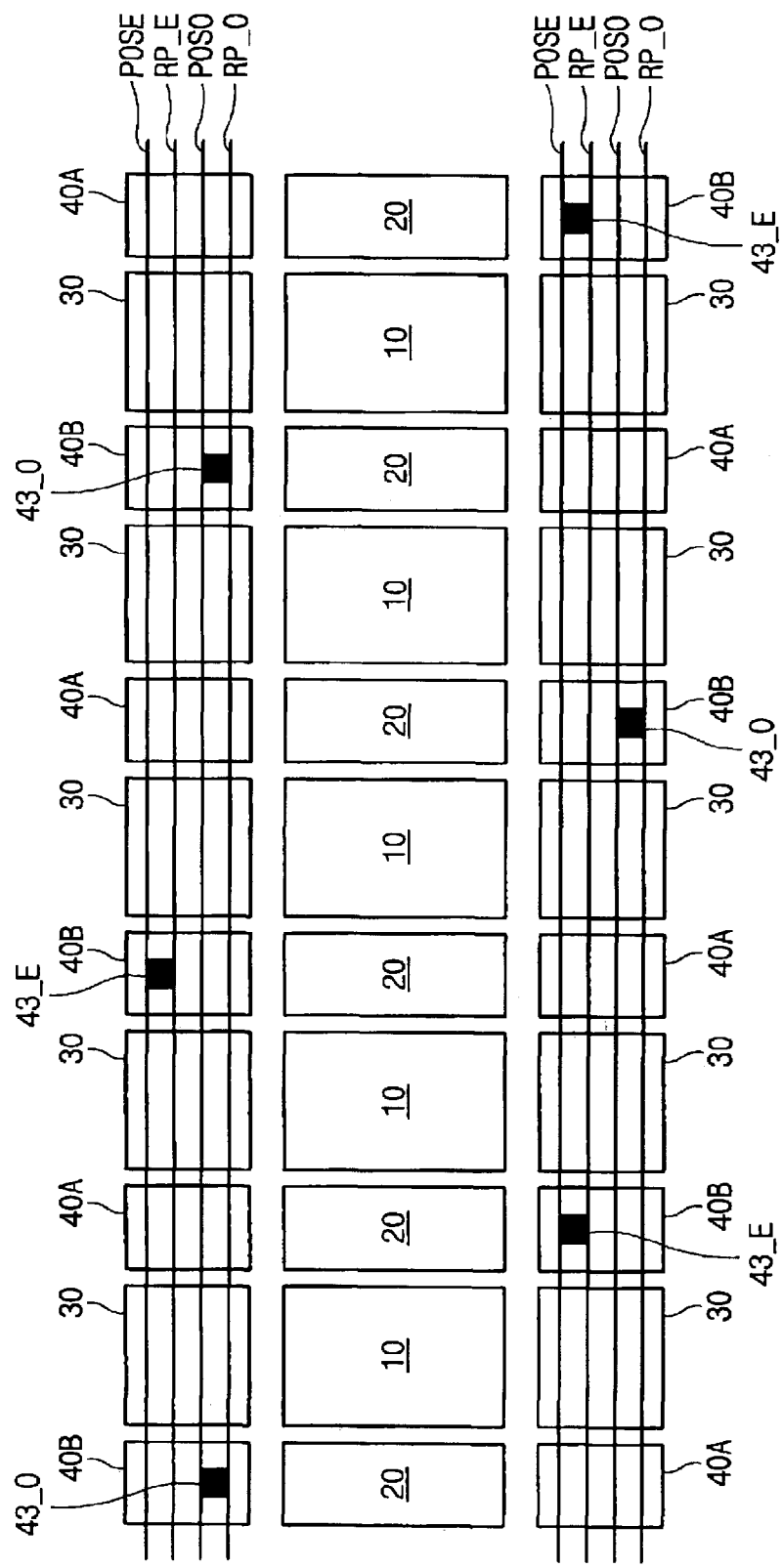
FIG. 10 is a layout diagram of an offset-compensated amplifier circuit according to the embodiment of the invention illustrated in FIG. 9.

FIG. 10 is a layout diagram of an offset-compensated amplifier circuit according to the embodiments of the invention illustrated in FIG. 9. The bias voltage generators 43_O and 43_E of the first and second differential amplifiers may be disposed together at the same conjunction region 40B. Alternatively, as shown in FIG. 10, the bias voltage generators 43_O and 43_E can be alternately disposed at conjunction regions 40B.

Figure 11A:
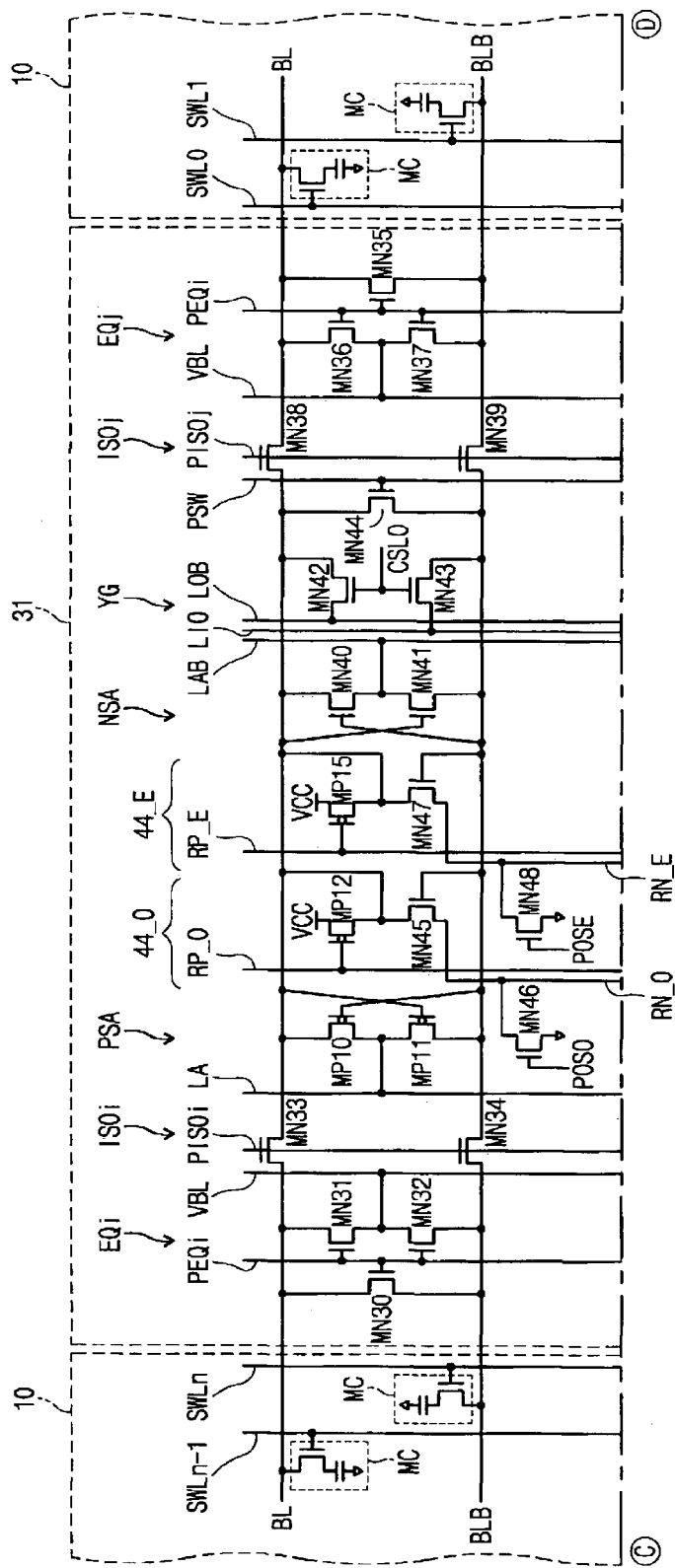
FIGS. 11A and 11B are circuit diagrams of an offset-compensated amplifier circuit and a sense amplifier circuit according to still another embodiment of the invention.
Figure 11B:
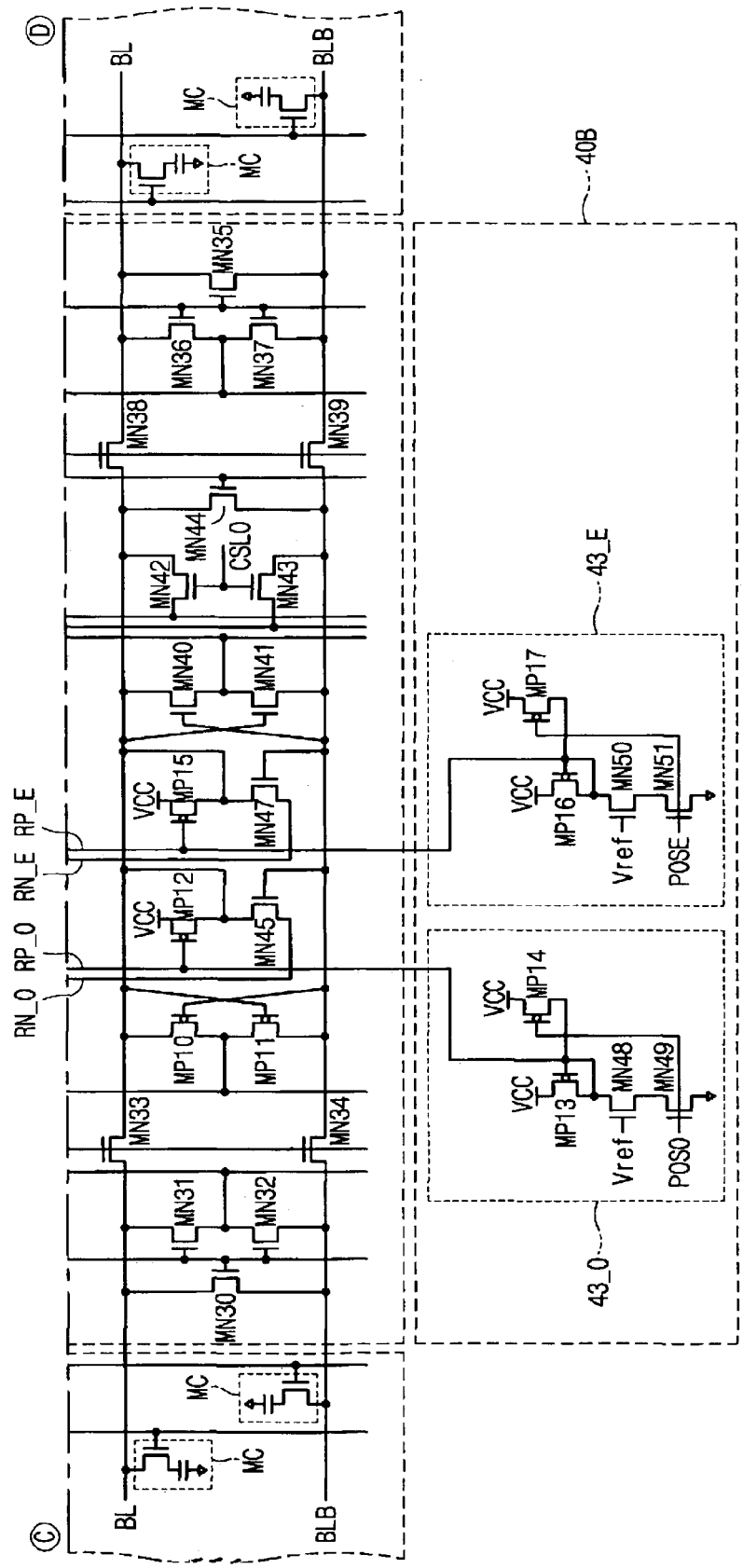

FIG. 11A and FIG. 11B are circuit diagrams of an offset-compensated amplifier circuit and a sense amplifier circuit according to still another embodiment of the invention. This embodiment is very similar to the embodiment illustrated in FIG. 9 but has differences as well. In the first differential amplifier, an NMOS transistor MN46 in the inverting amplifier is used in common by sense amplifier circuits of the column select unit. The NMOS transistor MN46 is turned on/off according to the control signal POSO of the first bias voltage generator 43_O. Likewise, in the second differential amplifier, an NMOS transistor MN48 in the inverting amplifier is used in common by sense amplifier circuits of the column select unit. The NMOS transistor MN48 is turned on/off according to the control signal POSE of the first bias voltage generator 43_E.

FIG. 12 is a layout diagram of an offset-compensated amplifier circuit according to an additional embodiment of the invention. In FIG. 12, constituent elements that are identical to the elements of FIG. 2 are marked by the same reference numerals, and descriptions of those elements is omitted. Referring to FIG. 12, unlike FIG. 2, signal lines RN and RP are separated on the basis of conjunction regions 40A. That is, the bias voltage generator 43 of the differential amplifier is laid out so as to be shared by adjacent sense amplification regions 30 that are disposed between two adjacent conjunction regions 40A. Except for this point, the offset-compensated amplifier circuit of FIG. 12 operates in the same manner as that in FIG. 3, and so the redundant description is omitted.

As set forth above, an offset-compensated amplifier circuit enables a flip-flop sense amplifier to perform stable sensing operations irrespective of its own offset voltage. The offset-compensated amplifier circuit is scattered and disposed at sense amplification and conjunction regions, respectively. Thus, the offset-compensated amplifier circuit can be applied to a high-density memory device using current design and process techniques.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:
1. A semiconductor memory device comprising:
a first and a second bit line in a first region and connected to a plurality of memory cells;
an offset-compensated amplifier circuit structured to detect a voltage variation of the first bit line based on a reference voltage and to drive the second bit line according to a detection result; and a sense amplifier circuit in a second region and structured to sense and amplify a voltage difference between the first and second bit lines, wherein the offset-compensated amplifier circuit is structured to compensate an offset voltage with respect to the reference voltage in response to a first control signal before the voltage variation of the first bit line is detected; and wherein a part of the offset-compensated amplifier circuit is disposed at the first region and a remaining part of the offset-compensated amplifier circuit is disposed at a third region that is different from the first and second regions.

2. The semiconductor memory device according to claim 1, wherein the offset-compensated amplifier circuit is structured to operate before row activation.

3. The semiconductor memory device according to claim 1, wherein the offset-compensated amplifier circuit is structured to be inactivated before activation of the sense amplifier circuit.

4. The semiconductor memory device according to claim 1, wherein the offset-compensated amplifier circuit is structured to be inactivated after activation of the sense amplifier circuit.

5. The semiconductor memory device according to claim 1, wherein the offset-compensated amplifier circuit comprises:

a differential amplifier having a first input terminal connected to the first bit line, a second input terminal connected to receive the reference voltage, and an output terminal connected to the second bit line; and a switch that is connected between the output terminal and the first input terminal and is structured to operate responsive to the first control signal.

6. The semiconductor memory device according to claim 1, wherein the offset-compensated amplifier circuit comprises:

a first means that operates responsive to a second control signal and is structured to generate a bias voltage according to the reference voltage;

a second means that is supplied with the bias voltage and is structured to establish a voltage of the second bit line in response to the voltage variation of the first bit line; and a switch that is connected between the first and second bit lines and is structured to operate responsive to the first control signal.

7. The semiconductor memory device according to claim 6, wherein the switch and the second means are in the second region, and the first means is in the third region.

8. The semiconductor memory device according to claim 7, wherein drivers for driving the sense amplifier circuit are located in the third region.

9. The semiconductor memory device according to claim 6, wherein the reference voltage is equal to a bit line precharge voltage.

10. The semiconductor memory device according to claim 6, wherein the reference voltage is greater than a bit line precharge voltage.

11. The semiconductor memory device according to claim 6, wherein the first means comprises:

a first transistor that has a current path formed between a power supply voltage a first internal node configured to output the bias voltage, and has a gate connected to the first internal node;

a second transistor that has a current path between the first internal node and a second internal node, and has a gate configured to receive the reference voltage; and a third transistor that has a current path formed between the second internal node a ground voltage, and has a gate configured to receive the second control signal.

12. The semiconductor memory device according to claim 11, wherein the first means further comprises a fourth transistor that has a current path formed between the power supply voltage and the first internal node, and has a gate configured to receive the second control signal.

13. The semiconductor memory device according to claim 12, wherein the second means comprises:

a fifth transistor that has a current path formed between the power supply voltage and the second bit line, and has a gate connected to receive the bias voltage; and a sixth transistor that has a current path formed between the output terminal and the second internal node, and has a gate connected to the one bit line.

14. The semiconductor memory device according to claim 5, further comprising a gate circuit that operates responsive to a first gate signal and a second gate signal, and that is connected between the first and second bit lines and the differential amplifier.

15. The semiconductor memory device according to claim 14, wherein the gate circuit connects the first bit line to the first input terminal of the differential amplifier and connects the second bit line to the output terminal of the differential amplifier in response to the first and second gate signals, respectively, the second input terminal of the differential amplifier being structured to be supplied with the reference voltage.

16. The semiconductor memory device according to claim 14, wherein the gate circuit connects the second bit line to the first input terminal of the differential amplifier and connects the first bit line to the output terminal of the differential amplifier in response to the first and second gate signals, respectively.

17. The semiconductor memory device according to claim 12, wherein the second means comprises:

a fifth transistor that has a current path formed between the power supply voltage and the second bit line, and has a gate connected to the second internal node;

a sixth transistor that has a current path formed between the second bit line and a third internal node, and has a gate connected to the first bit line; and a seventh transistor that has a current path formed between the third internal node and the ground voltage, and has a gate configured to receive the second control signal.

18. A semiconductor memory device comprising:

a first and a second bit line in a first region and connected to a plurality of memory cells;

a bias voltage generator circuit that operates responsive to a first control signal and is structured to generate a bias voltage based on a reference voltage;

a driver circuit structured to be supplied with the bias voltage and structured to drive the second bit line in response to voltage variation of the first bit line;

a switch structured to electrically connect the first and second bit lines in response to a second control signal; and a sense amplifier circuit in a second region and structured to sense and amplify a voltage difference between the first and second bit lines, wherein the bias voltage generator circuit and the driver circuit form a differential amplifier; and wherein the driver circuit and the switch are disposed at the second region and the bias voltage generator circuit is disposed at a third region different from the first and second regions.

19. The semiconductor memory device according to claim 18, wherein the first control signal is structured to be activated before row activation and inactivated before activation of the sense amplifier circuit.

20. The semiconductor memory device according to claim 18, wherein the first control signal is structured to be activated before row activation and inactivated after activation of the sense amplifier circuit.

21. The semiconductor memory device according to claim 18, wherein the second control signal is structured to be activated during a predetermined time before row activation.

22. The semiconductor memory device according to claim 18, wherein the bias voltage generator circuit comprises:
a first transistor that has a current path formed between a power supply voltage a first internal node configured to output the bias voltage, and has a gate connected to the first internal node;
a second transistor that has a current path formed between the first internal node and a second node and has a gate connected to receive the reference voltage;
a third transistor that has a current path formed between the second internal node and a ground voltage, and has a gate connected to receive the first control signal; and
a fourth transistor that has a current path formed between the power supply voltage and the first internal node and has a gate connected to receive the first control signal.

23. The semiconductor memory device according to claim 22, wherein the driver circuit comprises:
a fifth transistor that has a current path formed between the power supply voltage and the second bit line, and has a gate connected to the first internal node; and
a sixth transistor that has a current path formed between the second bit line and the second internal node, and has a gate connected to the first bit line.

24. The semiconductor memory device according to claim 22, wherein the driver circuit comprises:
a fifth transistor that has a current path formed between the power supply voltage and the second bit line, and has a gate connected to the second internal node;
a sixth transistor that has a current path formed between the second bit line and a third internal node, and has a gate connected to the first bit line; and
a seventh transistor that has a current path formed between the third internal node and the ground voltage, and has a gate connected to the second control signal.

25. The semiconductor memory device according to claim 18, wherein when the first and second control signals are activated, a negative feedback loop is formed at the differential amplifier via the switch, so that an input offset voltage of the differential amplifier is removed.

26. The semiconductor memory device according to claim 25, wherein the driver circuit drives the second bit line in response to voltage variation of the first bit line, after the input offset voltage of the differential amplifier is removed.

27. A semiconductor memory device comprising:
first, second, third, and fourth bit lines that are in a first region and connected to a plurality of memory cells;
a bias voltage generator circuit that operates responsive to a first control signal and generates a bias voltage based on a reference voltage;
a first driver circuit that is supplied with the bias voltage and drives the second bit line in response to voltage variation of the first bit line;
a second driver circuit that is supplied with the bias voltage and drives the fourth bit line in response to voltage variation of the third bit line;
a first switch circuit that electrically connects the first and second bit lines in response to a second control signal;
a second switch circuit that electrically connects the third and fourth bit lines in response to the second control signal;
a third switch circuit that provides the first and second driver circuits with a discharge path in response to the first control signal, respectively; and
a sense amplifier circuit that is placed at a second region and senses and amplifies a voltage difference between the first and second bit lines and a voltage difference between the third and fourth bit lines, respectively,
wherein the bias voltage generator circuit, the first driver circuit, and the third switch circuit form a first differential amplifier, and the bias voltage generator circuit, the second driver circuit, and the third switch circuit form a second differential amplifier; and
wherein the first and second driver circuits and the first to third switch circuits are in the second region, and the bias voltage generator circuit is located in a third region that is different from the first and second regions.

28. The semiconductor memory device according to claim 27, wherein the first driver circuit comprises:
a first transistor that has a current path formed between a power supply voltage and the second bit line, and has a gate connected to receive the bias voltage; and
a second transistor that has a current path formed between the second bit line and the third switch circuit, and has a gate connected to the first bit line.

29. The semiconductor memory device according to claim 27, wherein the second driver circuit comprises:
a first transistor that has a current path formed between a power supply voltage and the second bit line, and has a gate connected to receive the bias voltage; and
a second transistor that has a current path formed between the second bit line and the third switch circuit, and has a gate connected to the first bit line.

30. The semiconductor memory device according to claim 27, further comprising:
a first gate circuit that operates responsive to first and second gate signals, and is connected between the first and second bit lines and the first differential amplifier; and
a second gate circuit that operates responsive to the first and second gate signals, and is connected between the third and fourth bit lines and the second differential amplifier.

31. The semiconductor memory device according to claim 30, wherein the first differential amplifier has a first input terminal connected to the first bit line, a second input terminal supplied with the reference voltage, and an output terminal connected to the second bit line.

32. The semiconductor memory device according to claim 31, wherein the first gate circuit connects the first bit line to the first input terminal of the first differential amplifier and the second bit line to the output terminal of the first differential amplifier, in response to the first and second signals.

33. The semiconductor memory device according to claim 30, wherein the second differential amplifier has a, first input terminal connected to the third bit line, a second input terminal supplied with the reference voltage, and an output terminal connected to the fourth bit line.

34. The semiconductor memory device according to claim 33, wherein the first gate circuit connects the third bit line to the first input terminal of the first differential amplifier and connects the fourth bit line to the output terminal of the first differential amplifier, in response to the first and second signals.

35. The semiconductor memory device according to claim 33, wherein the first gate circuit connects the fourth bit line to the first input terminal of the first differential amplifier and connects the third bit line to the output terminal of the first differential amplifier, in response to the first and second signals.

36. The semiconductor memory device according to claim 27, wherein when the first and second control signals are activated a negative feedback loop is formed at the first differential amplifier via the first switch circuit, so that an input offset voltage of the first differential amplifier is removed.

37. The semiconductor memory device according to claim 36, wherein the first driver circuit drives the second bit line in response to voltage variation of the first bit line, after the input offset voltage of the first differential amplifier is removed.

38. The semiconductor memory device according to claim 27, wherein when the first and second control signals are activated a negative feedback loop is formed at the second differential amplifier via the second switch circuit, so that an input offset voltage of the second differential amplifier is removed.

39. The semiconductor memory device according to claim 38, wherein the second driver circuit drives the fourth bit line in response to voltage variation of the third bit line, after the input offset voltage of the second differential amplifier is removed.

40. A semiconductor memory device comprising:
 a first and a second bit line, each of which connected to a plurality of memory cells in a first region;
 a first bias voltage generator circuit which operates responsive to a first control signal and generates a first bias voltage based on a reference voltage;
 a second bias voltage generator circuit which operates responsive to a second control signal and generates a second bias voltage based on the reference voltage;
 a first driver circuit which is supplied with the first bias voltage and drives the second bit line in response to voltage variation of the first bit line;
 a second driver circuit which is supplied with the second bias voltage and drives the first bit line in response to voltage variation of the second bit line;
 a switch circuit which electrically connects the first and second bit lines in response to a third control signal; and
 a sense amplifier circuit which is disposed at a second region and senses and amplifies a voltage difference between the first and second bit lines,
 wherein the first bias voltage generator circuit and the first driver circuit form a first differential amplifier, and the second bias voltage generator circuit and the second driver circuit form a second differential amplifier; and
 wherein the first and second driver circuits and the switch circuit are located in the second region, and the first and second bias voltage generator circuits are located in a third region that is disposed at a different place from the first and second regions.

41. The semiconductor memory device according to claim 40, wherein a plurality of drivers configured to drive the sense amplifier are located in the third region.

42. The semiconductor memory device according to claim 40, wherein the first and second control signals are complementary signals.

43. The semiconductor memory device according to claim 40, wherein the first and second control signals are activated respectively before row activation and inactivated either before or after activation of the sense amplifier circuit.

44. The semiconductor memory device according to claim 40, wherein the third control signal is activated during a predetermined time before row activation.

45. The semiconductor memory device according to claim 40, wherein when the first and third control signals are activated, a negative feedback loop is formed at the first differential amplifier via the switch circuit, so that an input offset voltage of the first differential amplifier is removed.

46. The semiconductor memory device according to claim 40, wherein the first driver circuit drives the second bit line in response to voltage variation of the first bit line, after the input offset voltage of the first differential amplifier is removed.

47. The semiconductor memory device according to claim 40, wherein when the second and third control signals are activated a negative feedback loop is formed at the second differential amplifier via the switch circuit, so that an input offset voltage of the second differential amplifier is removed.

48. The semiconductor memory device according to claim 47, wherein the second driver circuit drives the first bit line in response to voltage variation of the second bit line, after the input offset voltage of the second differential amplifier is removed.

49. A semiconductor memory device comprising:
 first, second, third, and fourth bit lines each of which is connected to a plurality of memory cells disposed at a first region;
 a first bias voltage generator circuit that operates responsive to a first control signal and generates a first bias voltage based on a reference voltage;
 a second bias voltage generator circuit that operates responsive to a second control signal and generates a second bias voltage based on the reference voltage;
 a first driver circuit that is supplied with the first bias voltage and drives the second bit line in response to voltage variation of the first bit line;
 a second driver circuit that is supplied with the first bias voltage and drives the fourth bit line in response to voltage variation of the third bit line;
 a first switch circuit that electrically connects the first and second bit lines in response to a third control signal;
 a second switch circuit that electrically connects the third and fourth bit lines in response to the third control signal;
 a third switch circuit that provides a discharge path to the first driver circuit in response to the first control signal;
 a fourth switch circuit that provides a discharge path to the second driver circuit in response to the second control signal; and
 a sense amplifier circuit that is located in a second region and senses and amplifies voltage differences between the first and second bit lines and between the third and fourth bit lines, respectively,
 wherein the first bias voltage generator circuit, the first driver circuit, and the third switch circuit form a first differential amplifier, and the second bias voltage generator circuit, the second driver circuit, and the fourth switch circuit form a second differential amplifier; and wherein the first and second driver circuits and the first to fourth switch circuits are located in the second region, and the first and second bias voltage generator circuits are located in a third region that is different from the first and second regions.

50. The semiconductor memory device according to claim 49, wherein drivers for driving the sense amplifier are located in the third region.

51. The semiconductor memory device according to claim 49, wherein the first and second control signals are complementary signals.

52. The semiconductor memory device according to claim 51, wherein the first and second control signals are activated before row activation and inactivated either before or after activation of the sense amplifier.

53. The semiconductor memory device according to claim 49, wherein the third control signal is activated during a predetermined time before row activation.

54. The semiconductor memory device according to claim 49, wherein when the first and third control signals are activated, a negative feedback loop is formed at the first differential amplifier via the first switch circuit, so that an input offset voltage of the first differential amplifier is removed.

55. The semiconductor memory device according to claim 54, wherein the first driver circuit drives the second bit line in response to voltage variation of the first bit line, after the input offset voltage of the first differential amplifier is removed.

56. The semiconductor memory device according to claim 49, wherein when the second and third control signals are activated a negative feedback loop is formed at the second differential amplifier via the second switch circuit, so that an input offset voltage of the second differential amplifier is removed.

57. The semiconductor memory device according to claim 56, wherein the second driver circuit drives the first bit line in response to voltage variation of the second bit line, after the input offset voltage of the second differential amplifier is removed.

* * * * *

UNITED STATES PATENT AND TRADEMARK OFFICE
CERTIFICATE OF CORRECTION

PATENT NO. : 6,819,600 B2  
DATED : November 16, 2004  
INVENTOR(S) : Sim

Page 1 of 1

It is certified that error appears in the above-identified patent and that said Letters Patent is hereby corrected as shown below:

<u>Column 16,</u>
Line 67, replace "has a, first input" with -- has a first input --.

Signed and Sealed this

Twenty-fourth Day of January, 2006

JON W. DUDAS  
*Director of the United States Patent and Trademark Office*